US010721847B2

(12) United States Patent
Hoshikawa et al.

(10) Patent No.: US 10,721,847 B2
(45) Date of Patent: Jul. 21, 2020

(54) NOZZLE MANAGEMENT DEVICE

(71) Applicant: FUJI CORPORATION, Chiryu (JP)

(72) Inventors: Kazumi Hoshikawa, Toyohashi (JP);
Kenji Shimosaka, Obu (JP);
Tadakatsu Ibe, Chiryu (JP)

(73) Assignee: FUJI CORPORATION, Chiryu (JP)

( * ) Notice: Subject to any disclaimer, the term of this patent is extended or adjusted under 35 U.S.C. 154(b) by 0 days.

(21) Appl. No.: 16/363,602

(22) Filed: Mar. 25, 2019

(65) Prior Publication Data

US 2019/0223336 A1    Jul. 18, 2019

Related U.S. Application Data

(63) Continuation of application No. 15/305,228, filed as application No. PCT/JP2014/061315 on Apr. 22, 2014, now Pat. No. 10,292,319.

(51) Int. Cl.
*H05K 13/04* (2006.01)
*H05K 13/08* (2006.01)
*G01L 5/00* (2006.01)

(52) U.S. Cl.
CPC ........ *H05K 13/0404* (2013.01); *G01L 5/0076* (2013.01); *H05K 13/0409* (2018.08); *H05K 13/082* (2018.08); *H05K 13/04* (2013.01); *H05K 13/041* (2018.08); *H05K 13/0408* (2013.01); *H05K 13/0434* (2013.01); *H05K 13/0452* (2013.01); *H05K 13/087* (2018.08)

(58) Field of Classification Search
CPC ............... H05K 13/04; H05K 13/0404; H05K 13/0408; H05K 13/0409; H05K 13/082; H05K 13/0434; H05K 13/041; H05K 13/0452; G01L 5/0076

See application file for complete search history.

(56) References Cited

U.S. PATENT DOCUMENTS

| 5,285,946 | A   |   | 2/1994 | Tomigashi  |             |
|-----------|-----|---|--------|------------|-------------|
| 5,727,311 | A   | * | 3/1998 | Ida ...... | H05K 13/021 |
|           |     |   |        |            | 29/832      |
| 6,176,007 | B1  | * | 1/2001 | Kashiwagi  | H05K 13/0434|
|           |     |   |        |            | 29/729      |
| 6,176,011 | B1  | * | 1/2001 | Shirakawa  | H05K 13/021 |
|           |     |   |        |            | 29/740      |
| 6,193,136 | B1  | * | 2/2001 | Higashi    | B23K 20/10  |
|           |     |   |        |            | 228/106     |

(Continued)

FOREIGN PATENT DOCUMENTS

| JP | 2006-108384 A | 4/2006 |
| JP | 2008-227140 A | 9/2008 |

(Continued)

OTHER PUBLICATIONS

International Search Report dated Jul. 15, 2014 in PCT/JP2014/061315 filed Apr. 22, 2014.

(Continued)

*Primary Examiner* — Jonathan M Dunlap
(74) *Attorney, Agent, or Firm* — Oblon, McClelland, Maier & Neustadt, L.L.P.

(57) ABSTRACT

A nozzle management device includes a plurality of pallets, each of the pallets configured to house a plurality of nozzles; a pallet storage device configured to store the pallets; and a pallet moving device configured to move the pallets.

28 Claims, 21 Drawing Sheets

(56) References Cited

U.S. PATENT DOCUMENTS

| | | | | |
|---|---|---|---|---|
| 6,223,425 B1* | 5/2001 | Asai | ............... | H05K 13/0434 |
| | | | | 29/740 |
| 6,640,431 B1 | 11/2003 | Yoriki | | |
| 6,868,603 B2* | 3/2005 | Okuda | ............ | H05K 13/0409 |
| | | | | 29/832 |
| 8,881,385 B2* | 11/2014 | Endo | .............. | H05K 13/0452 |
| | | | | 29/840 |
| 10,143,119 B2* | 11/2018 | Hosaka | ............ | H05K 13/0408 |
| 10,192,300 B2* | 1/2019 | Amano | ............. | G01B 11/002 |
| 10,217,206 B2* | 2/2019 | Hosaka | ................ | G01D 5/30 |
| 10,233,020 B2* | 3/2019 | Hoshikawa | ......... | H05K 13/0409 |
| 10,233,030 B2* | 3/2019 | Matsumoto | ........... | B65G 47/14 |
| 10,285,315 B2* | 5/2019 | Iisaka | ............. | H05K 13/021 |
| 10,285,319 B2* | 5/2019 | Iisaka | ............. | H05K 13/0882 |
| 10,292,319 B2* | 5/2019 | Hoshikawa | ......... | G01L 5/0076 |
| 10,299,418 B2* | 5/2019 | Muratsuchi | ......... | H05K 13/043 |
| 10,375,870 B2* | 8/2019 | Oyama | ............. | H05K 13/085 |
| 10,391,594 B2* | 8/2019 | Hoshikawa | ......... | H05K 13/087 |
| 10,420,266 B2* | 9/2019 | Hosaka | ............ | H05K 13/0408 |
| 10,441,980 B2* | 10/2019 | Hoshikawa | ......... | H01L 21/304 |
| 2003/0192177 A1 | 10/2003 | Kadohata | | |
| 2006/0111222 A1 | 5/2006 | Yasui | | |
| 2007/0014652 A1* | 1/2007 | Kanno | ................. | G01R 31/01 |
| | | | | 414/222.13 |
| 2009/0229118 A1 | 9/2009 | Haugen | | |
| 2010/0229380 A1* | 9/2010 | Endo | ................. | H05K 13/0452 |
| | | | | 29/760 |
| 2011/0011919 A1 | 1/2011 | Yoshimoto | | |
| 2014/0217153 A1 | 8/2014 | Yoshimoto | | |

FOREIGN PATENT DOCUMENTS

| | | |
|---|---|---|
| JP | 2010-108961 A | 5/2010 |
| JP | 2010-251351 A | 11/2010 |
| WO | WO 2005/027614 A1 | 3/2005 |

OTHER PUBLICATIONS

Extended European Search Report dated Nov. 14, 2017 in Patent Application No. 14890059.0.

European Office Action dated Oct. 10, 2018 in Patent Application No. 14 890 059.0, 6 pages.

U.S. Appl. No. 16/540,898, filed Aug. 14, 2019, Kazumi Hoshikawa, et al.

* cited by examiner

NOZZLE MANAGEMENT DEVICE

CROSS-REFERENCE TO RELATED APPLICATIONS

This application is a continuation of and is based upon and claims the benefit of priority under 35 U.S.C. § 120 for U.S. Ser. No. 15/305,228, filed Oct. 19, 2016, the entire contents of which are incorporated herein by reference.

TECHNICAL FIELD

The present invention relates to a load measurement method for measuring a load that arises when a suction tube and a pipe of a suction nozzle move relative to each other, and a collection method for collecting a suction nozzle which is determined as abnormal based on the measured load.

BACKGROUND ART

A suction nozzle picks up and holds an electronic component during work of mounting electronic components on a circuit board. A suction nozzle is configured such that, when the tip section of the suction nozzle contacts an electronic component, and when mounting a held electronic component on a circuit board, the suction tube and pipe of the suction nozzle move relative to each other so as to make the load applied on the electronic component small. However, there is a problem in that if the load that arises when the suction tube and pipe move relative to each other (hereinafter sometimes referred to as "nozzle load") becomes too large due to aging and so on of the suction tube, it is not possible to perform mounting work appropriately. Thus, measurement of the nozzle load is performed regularly, and suction nozzles for which the measured load exceeds a specified load are collected in a collection box or the like. In the patent literature below, an example is disclosed of a load measurement method for measuring nozzle load in which a load sensor such as a load cell is used.

Patent Literature 1: JP A 2006-108384

SUMMARY OF INVENTION

Technical Problem

As disclosed in the above patent literature, by using a load sensor such as a load cell, it is possible to appropriately measure nozzle load. However, because nozzle load is relatively small, a highly sensitive load sensor such as a load cell is used, and there is a tendency for the load sensor to be damaged if the pipe and suction tube do not move relatively due to the presence of foreign matter or the like. The present invention takes account of such problems and an object thereof is to appropriately measure nozzle load without damaging a load sensor.

Also, whether a suction nozzle is normal is determined based on the measured nozzle load, and suction nozzles that are determined to be abnormal are put into a collection box or the like. Then, the suction nozzles are collected from the collection box and repair or the like performed. However, if suction nozzles are put into the collection box in a disorderly manner, suction nozzles tend to be damaged beyond repair due to being put into the collection box. The present invention takes account of such problems and an object thereof is to appropriately collect a suction nozzle that has been determined to be abnormal based on a measured nozzle load.

Solution to Problem

To solve the above problems, disclosed is a load measurement method for measuring a load that arises when a suction tube, which is for picking up and holding a component via the suction of air, and a pipe, which holds the suction tube internally so as to be relatively movable with a tip section of the suction tube protruding from the pipe, move relative to each other by a specified amount, the load measurement method including: a moving step of moving the suction nozzle and a rigid body in a direction to approach each other using a predetermined set load, the tip section of the suction nozzle being in contact with the suction tube; and a load measuring step for using a load sensor to measure a load that arises when the suction tube and the pipe move relative to each other while the tip section of the suction tube and the load sensor are in contact in a case in which the suction nozzle and the load sensor are moved in a direction to approach each other, with the tip section of the suction tube and the load sensor facing each other, and on condition that the suction tube and the pipe have moved relative to each other by the specified amount in the moving step.

To solve the above problems, also disclosed is a collection method for collecting the suction nozzle judged not to be normal based on the load extracted in the first load extracting step or the second load extracting step, the collection method including: a holding step of holding, via a holding tool, the suction nozzle for which the load extracted in the first load extracting step or the second load extracting step exceeds a predetermined tolerance load; a moving step of moving, via a moving device, the holding tool that held the suction nozzle in the holding step above an inclined surface of a collection box with a bottom surface configured from the inclined surface and an uninclined flat surface connected to a lower edge of the inclined surface; and a releasing step of releasing the suction nozzle from the holding tool after the holding tool has been moved above the inclined surface in the moving step.

Advantageous Effects of Invention

According to the disclosed load measurement method, before the nozzle load is measured by the load sensor, a rigid body is pushed against the tip section of the suction tube, and it is determined whether the suction tube and the pipe have moved relative to each other by a set amount due to the pushing of the rigid body. Then, for the suction nozzle for which the suction tube and the pipe moved relative to each other by the set amount due to the pushing of the rigid body, the nozzle load is measured using a load sensor. By this, it is possible to perform measurement of nozzle load using the load sensor only for a suction nozzle for which relative movement of the suction tube and the pipe has been confirmed, thereby allowing nozzle load to be measured appropriately without damaging the load sensor. Further, because a relatively large load is applied by the rigid body in the relative movement direction between the pipe and the suction tube, even if the pipe and the suction tube are stuck due to foreign matter or the like, the foreign matter may be removed due to the burden of the load. That is, nozzles for which there is virtually no relative movement between the pipe and the suction tube may be fixed by relative movement becoming possible due to the burden of the load.

Further, in the disclosed collection method, the bottom surface of the collection box is configured from an inclined surface and an uninclined flat surface connected to a lower edge of the inclined surface. A suction nozzle determined not to be normal based on the load measured by the load measurement method is held by a holding tool and the held nozzle is released above the inclined, surface of the bottom surface of the collection box. Thus, the suction nozzle falls onto the inclined surface, and rolls down onto the flat surface, where it then remains. Accordingly, even when suction nozzles are put into the collection box consecutively, because the suction nozzles are released above the inclined surface, falling suction nozzles do not collide strongly with suction nozzles already inside the collection box. Thus, it is possible to effectively prevent damage to nozzles due to collisions between nozzles, and suction nozzles can be collected appropriately.

DESCRIPTION OF PREFERRED EMBODIMENTS

Figure 1:
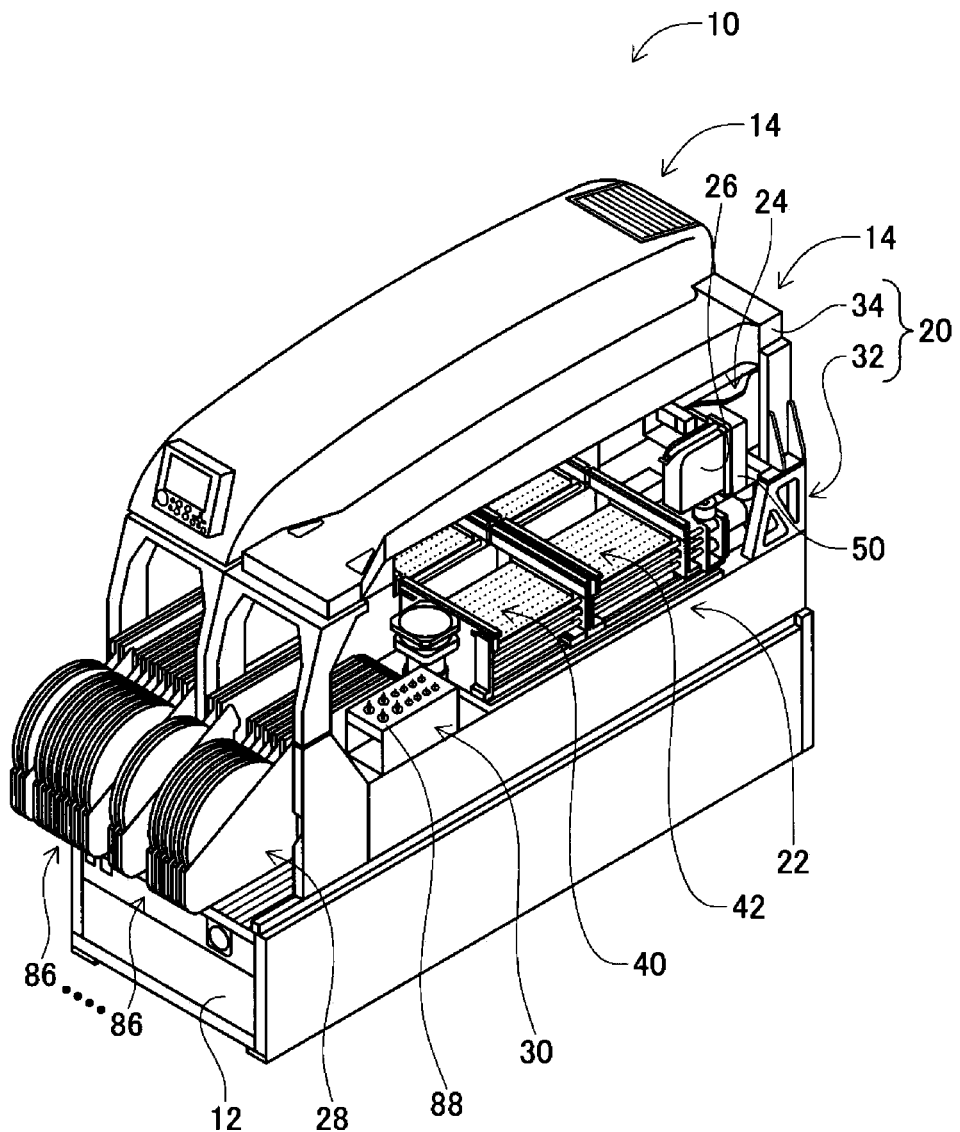
FIG. 1 is a perspective view of an electronic component mounter.

The following describes in detail referring to the figures an example embodiment of the present invention, Configuration of Electronic Component Mounting Device An electronic component mounting device (hereinafter in some cases abbreviated to "mounting device") 10 is shown in FIG. 1. Mounting device 10 includes one system base 12, and two electronic component mounters (hereinafter in some cases abbreviated to "mounter") 14 provided adjacently to each other on the system base 12. Note that, the direction in which the mounters 14 are lined up is referred to as the X-axis direction, and the horizontal direction which is perpendicular to the X-axis direction is referred to as the Y-axis direction.

Each mounter 14 is provided mainly with mounter body 20, conveyance device 22, mounting head moving device (hereinafter in some cases abbreviated to "moving device") 24, mounting head 26, supply device 28, and nozzle station 30. Mounter body 20 is configured from frame 32 and beam 34 that is mounted on the frame 32.

Conveyance device 22 is provided with two conveyor devices 40 and 42. The two conveyor devices 40 and 42 are parallel to each other and are provided on frame 32 extending in the X-axis direction. Each of the two conveyor devices 40 and 42 conveys a circuit board held on the respective conveyor devices 40 and 42 in the X-axis direction using an electromagnetic motor (not shown). Also, the circuit board is fixedly held at a predetermined position by a board holding device (not shown).

Moving device 24 is an XY robot type moving device. Moving device 24 is provided with an electromagnetic motor (not shown) that slides a slider 50 in the X-axis direction, and an electromagnetic motor (not shown) that slides slider 50 in the Y-axis direction. Mounting head 26 is attached to slider 50, and the mounting head 26 is moved to any position on frame 32 by the operation of the two electromagnetic motors 52 and 54.

Figure 2:
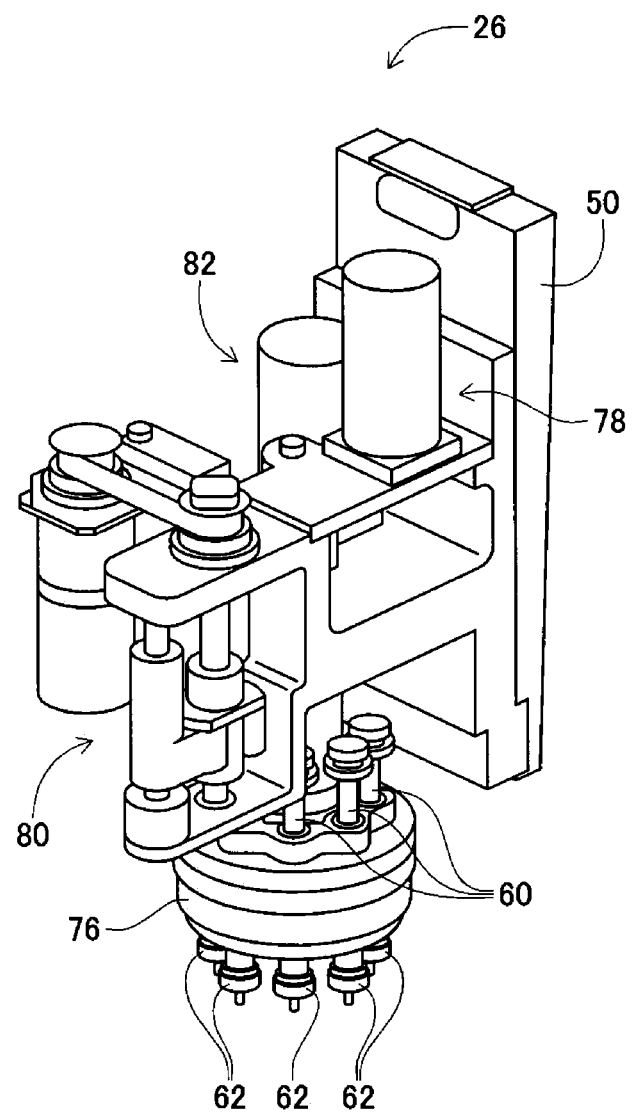
FIG. 2 is a perspective view of a mounting head provided on the electronic component mounter.
Figure 3:
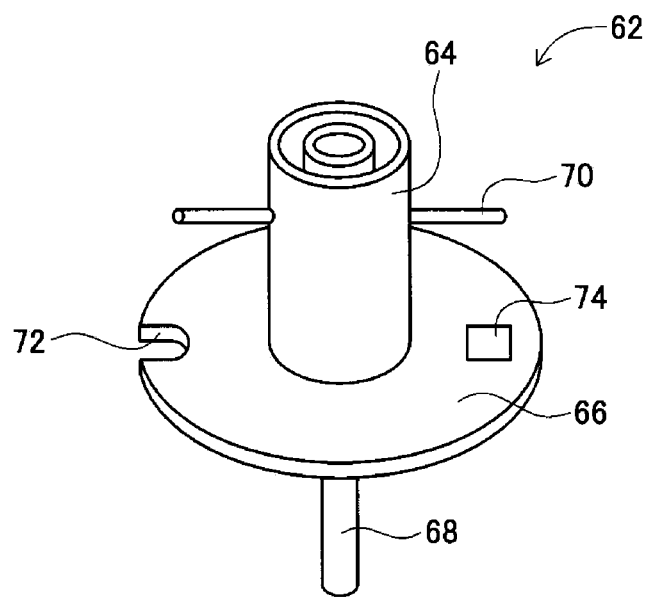
FIG. 3 is perspective view of a suction nozzle.

Mounting head 26 mounts electronic components on a circuit board. As shown in FIG. 2, mounting head 26 includes multiple rod-shaped mounting units 60; a suction nozzle 62 is attached to the lower end of each of the multiple mounting units 60. As shown in FIG. 3, suction nozzle 62 is configured from body pipe 64, flange 66, suction tube 68, and locking pin 70. Body pipe 64 is cylindrical and flange 66 is fixed to the outer surface of body pipe 64 so as to project outwards. Suction tube 68 is a thin pipe that is held on body pipe 64 movable in an axis line direction in a state extending downwards from the lower end of body pipe 64. Note that, among suction nozzles 62 there are those in which elastic force is applied to suction tube 68 and those in which elastic force is not applied to suction tube 68.

In detail, in a suction nozzle 62 in which elastic force is applied to suction tube 68, a spring (not shown) in a compressed state is provided between suction tube 68 and body pipe 64; and suction tube 68 is biased in a direction extending downwards from the lower end of body pipe 64 by the elastic force of the spring. In other words, by applying a force to the tip of suction tube 68 against the elastic force of the spring, suction tube 68 retreats inside body pipe 64. In contrast, in a suction nozzle 62 in which elastic force is not applied to suction tube 68, a spring is not provided between suction tube 68 and body pipe 64. However, in a suction nozzle 62 not provided with a spring between suction tube 68 and body pipe 64, a spring (not shown) is mounted on the tip section of an internally provided mounting unit 60. The internal spring of mounting unit 60 applies elastic force to suction tube 68 of suction nozzle 62 mounted on mounting unit 60. By this, the suction tube 68 is biased so as extend down from the lower end of body pipe 64 by the elastic force of the spring of mounting unit 60. That is, even for a suction nozzle 62 not provided with a spring between suction tube 68 and body pipe 64, by mounting suction nozzle 62 on mounting unit 60 provided with an internal spring, when applying a force to the tip of suction tube 68 against the elastic force of the spring, suction tube 68 retreats inside body pipe 64.

Also, locking pin 70 of suction nozzle 62 is provided on an upper section of body pipe 64 such that locking pin 70 extends in the diameter direction of body pipe 64. Suction nozzle 62 is attached to the lower end of mounting unit 60 using locking pin 70 such that suction nozzle 62 is attachable/detachable with one touch. The method of attachment of suction nozzle 62 to mounting unit 60 using locking pin 70 is well known, so descriptions are omitted. Also, a cutout 72 is formed in the outer edge of flange 66 and 2D code 74 is provided on the upper surface of flange 66.

Suction tube 68 of suction nozzle 62 is connected to a positive/negative pressure supply device (not shown) via a negative pressure air and positive pressure air passage. Thus, the tip of suction tube 68 of suction nozzle 62 picks up and holds an electronic component using negative pressure, and releases the held electronic component using positive pressure. As shown in FIG. 2, rod-shaped mounting units 60 are held on the outer surface of unit holding body 76 at a pitch of equal angles such that the axis direction of the mounting units 60 is vertical. And, each suction nozzle 62 extends downwards from the bottom surface of unit holding body 76.

Also, unit holding body 76 is intermittently rotated by equal angle increments at the arrangement angle pitch of mounting units 60 by holding body rotating device 78. Thus, the multiple mounting units 60 are stopped successively at a raising/lowering station which is one of the stopping positions of the mounting units 60. A mounting unit 60 that has stopped at the raising/lowering station is raised/lowered by unit raising/lowering device 80. Also, a mounting unit 60 that has stopped at the raising/lowering station is rotated about its own axis by unit rotating device 82.

Supply device 28 is a feeder type supply device and, as shown in FIG. 1, is provided on the front end of frame 32. Supply device 28 has tape feeders 86. Tape feeder 86 houses taped components in a wound state. Taped components are electronic components that have been put into tape. And, tape feeder 86 feeds taped components using a feeding device (not shown). Accordingly, feeder type supply device 28 supplies an electronic component to a supply position through the feeding delivery of the taped components.

Figure 4:
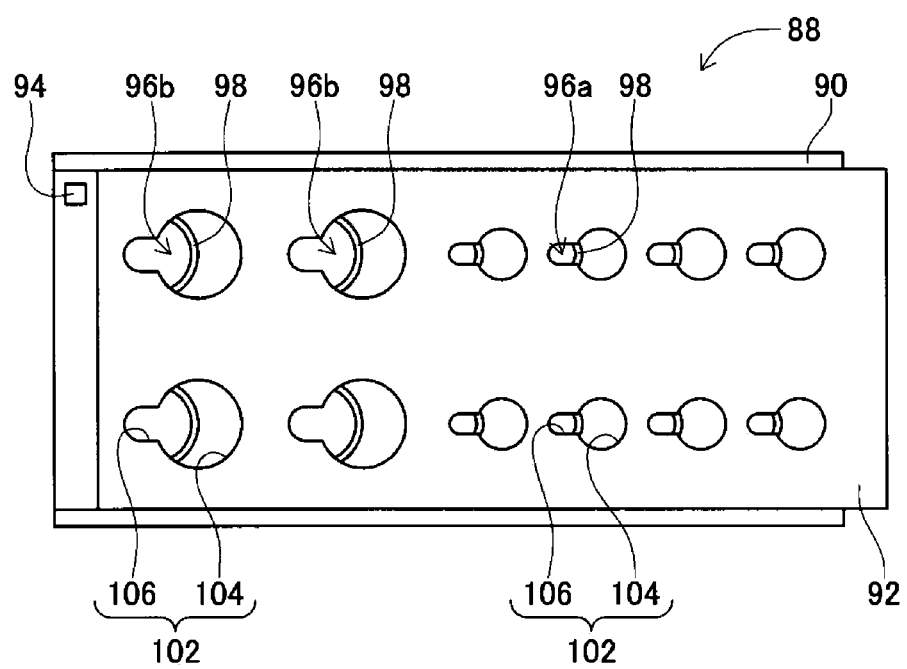
FIG. 4 is a plan view of a nozzle tray in a partially exposed state.

Nozzle station 30 is for storing multiple suction nozzles 62 and has nozzle tray 88. As shown in FIG. 4, nozzle tray 88 has base plate 90 and cover plate 92; cover plate 92 is slidably provided on base plate 90. Note that, base plate 90 and cover plate 92 have roughly the same dimensions, and when cover plate 92 is slid with respect to base plate 90, 2D code 94 provided at an end of base plate 90 is exposed. Conversely, as shown in FIG. 5, when cover plate 92 entirely overlaps base plate 90, 2D code 94 is covered by cover plate 92.

Figure 5:
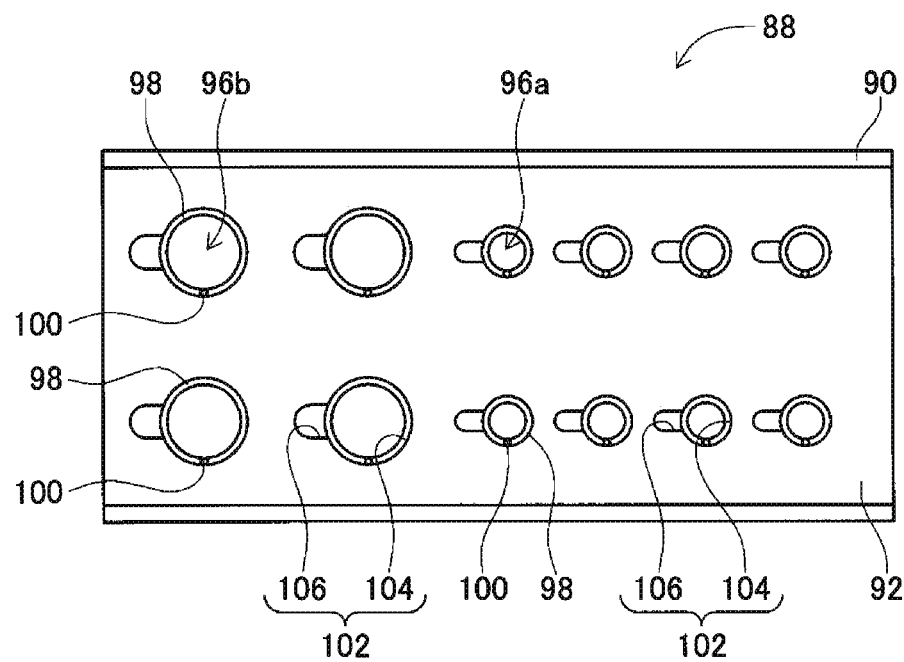
FIG. 5 is a plan view of a nozzle tray in a fully exposed state.
Figure 6:
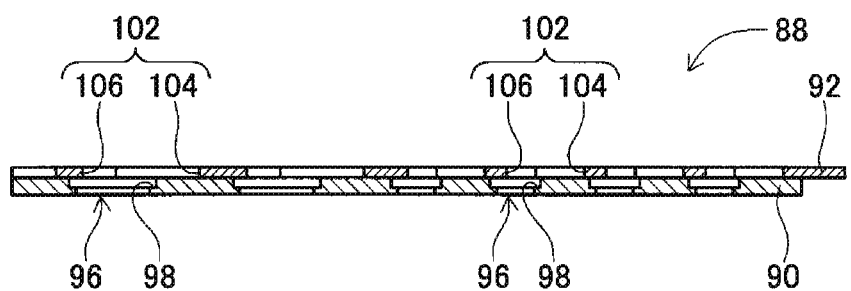
FIG. 6 is a side view of the nozzle tray of FIG. 4.
Figure 7:
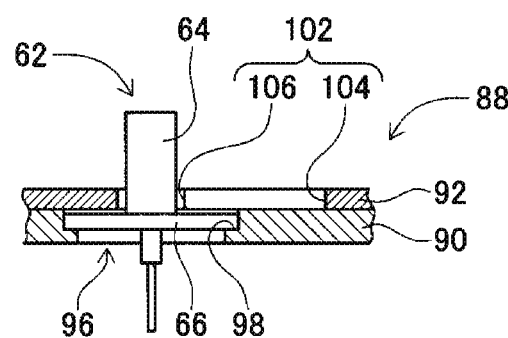
FIG. 7 is a cross section showing the nozzle tray storing a suction nozzle.
Figure 8:
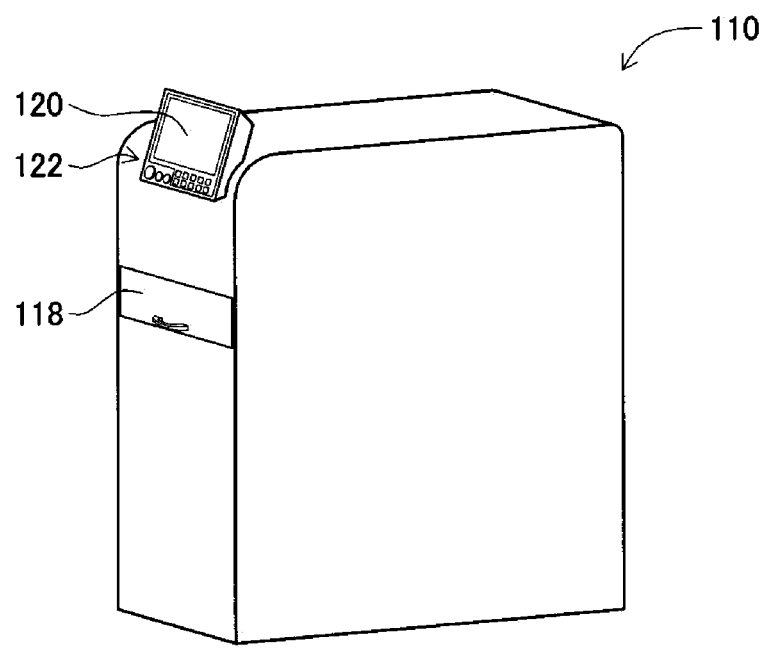
FIG. 8 is a perspective view showing a nozzle management device.

As shown in FIG. 4 and FIG. 6 that is a cross-section of nozzle tray 88, multiple loading holes 96 are formed in base plate 90. Loading hole 96 is a stepped through-hole into which a suction nozzle 62 can be loaded. In detail, the internal diameter of stepped surface 98 of stepped through-hole 96 is slightly larger than the outer diameter of flange 66 of suction nozzle 62, and as shown in FIG. 7, flange 66 of suction nozzle 62 is loaded on the stepped surface 98. Also, pin (refer to FIG. 5) 100 is provided on stepped surface 98 and cutout 72 of flange 66 engages with the pin 100. Thus, suction nozzle 62 loaded in loading hole 96 is prohibited from being rotated around its own axis. Note that, for loading holes 96, there are loading holes 96a with a small diameter and loading holes 96b with a large diameter; a small suction nozzle 62 is loaded in a loading hole 96a with a small diameter, and a large suction nozzle 62 is loaded in a loading hole 96b with a large diameter.

Also, holes 102 are formed in cover plate 92 to correspond to the multiple loading holes 96 of base plate 90. Hole 102 is configured from circular hole section 104 and slot section 106. Circular hole section 104 is circular with an internal diameter slightly larger than stepped surface 98 of the corresponding loading hole 96. Also, slot section 106 is a portion which forms a cutout in the edge of circular hole section 104, and is a cutout section that is slightly larger than the outer diameter of body pipe 64 of suction nozzle 62.

With nozzle tray 88 with the configuration given above, by sliding cover plate 92 with respect to base plate 90, it is possible to switch between a state in which, as shown in FIG. 4, loading hole 96 is partially exposed via hole 102 (hereinafter referred to as "partially exposed state"), and a state in which, as shown in FIG. 5, hole 96 is entirely exposed via hole 102 (hereinafter referred to as "entirely exposed state").

In detail, in the entirely exposed state, as shown in FIG. 5, the center of loading hole 96 and the center of circular hole section 104 of hole 102 are aligned such that stepped surface 98 of loading hole 96 is fully exposed. Thus, in the entirely exposed state, it is possible to load a suction nozzle 62 in loading hole 96, and to remove a suction nozzle 62 from loading hole 96. In other words, in the entirely exposed state, it is possible to house suction nozzles 62 in nozzle tray 88, and to remove suction nozzles 62 from nozzle tray 88.

Conversely, in the partially exposed state, as shown in FIG. 4, the center of loading hole 96 and the center of circular hole section 104 of hole 102 are not aligned, such that a portion of stepped surface 98 of loading hole 96 is covered by cover plate 92. Thus, in the partially exposed state, it is not possible to load a suction nozzle 62 in loading hole 96, or to remove a suction nozzle 62 from loading hole 96. In other words, in the partially exposed state, it is not possible to house suction nozzles 62 in nozzle tray 88, or to remove suction nozzles 62 from nozzle tray 88. However, in the partially exposed state, the center of loading hole 96 and the center of slot section 106 of hole 102 are aligned, and as shown in FIG. 7, body pipe 64 of suction nozzle 62 loaded in loading hole 96 extends above cover plate 92 from slot section 106.

Also, cover plate 92 can be slid with respect to base plate 90 between the entirely exposed state and the partially exposed state, and is biased in the direction of the partially exposed state by a spring (not shown). In other words, usually, the housing of suction nozzles 62 into nozzle tray 88 and the removal of suction nozzles 62 from nozzle tray 88 is prohibited. However, nozzle station 30 has a plate moving mechanism (not shown) that slides cover plate 92 against the elastic force of the spring in the direction leading to the entirely exposed state, and by cover plate 92 being slid by the operation of the plate moving mechanism, the housing of suction nozzles 62 into nozzle tray 88, and the removal of suction nozzles 62 from nozzle tray 88, are allowed. Note that, nozzle tray 88 is attachable/detachable to/from nozzle station 30 such that the collection of suction nozzles 62 housed in nozzle station 30, or the replenishment of suction nozzles 62 to nozzle station 30, and the like, can be performed outside mounter 14.

Mounting Work by a Mounter

It is possible to perform mounting work with respect to a circuit board held in conveyance device 22 using mounting head 26 in mounter 14 with the above configuration. Specifically, based on commands of a control device (not shown) of mounter 14, a circuit board is conveyed to a work position, and the circuit board is fixedly held at that position by a board holding device. Also, based on commands of the control device, tape feeder 86 feeds taped components and supplies an electronic component to a supply position. Then, mounting head 26 moves above the supply position of the electronic component and picks up and holds the electronic component using suction nozzle 62. Continuing, mounting head 26 moves above the circuit board and mounts the held electronic component on the circuit board.

Exchange of Suction Nozzles in a Nozzle Station

In mounter 14, as given above, an electronic component supplied by tape feeder 86 is picked up and held by suction nozzle 62 and then mounted on the circuit board. In mounter 14 configured in this way, suction nozzles 62 are changed according to the size, type, and so on of the electronic components. In other words, for example, when picking up and holding a large electronic component, a suction nozzle 62 with a large diameter is used; when picking up and holding a small electronic component, a suction nozzle 62 with a small diameter is used. Thus, according to the type of circuit board to be manufactured, it is required to use various types of suction nozzles 62, such that various types of suction nozzles 62 are housed in nozzle station 30 according to the type of circuit board to be manufactured. Thus, exchange and so on is performed as necessary between suction nozzles 62 attached to mounting units 60 of mounting head 26 and suction nozzles 62 housed in nozzle station 30. Note that, methods of exchange and so on between suction nozzles 62 attached to mounting units 60 of mounting head 26 and suction nozzles 62 housed in nozzle station 30 are well known, so descriptions are omitted.

As given above, various types of suction nozzles 62 are housed in nozzle station 30 according to the type of circuit board to be manufactured. Thus, for example, when the type of circuit board being manufactured is changed, nozzle tray 88 is removed from nozzle station 30, and suction nozzles 62 housed in nozzle tray 88 are exchanged using a nozzle management device. The nozzle management device is described in detail below.

Configuration of Nozzle Management Device

Nozzle management device 110 is largely a rectangular cuboid and a drawer 118 for storing nozzle tray 88 inside nozzle management device 110, and for removing nozzle tray 88 from nozzle management device 110, is provided on the front surface of nozzle management device 112. Panel 120 for displaying various information, operation switches 122 for performing inputting of information, and the like, are provided above drawer 118.

Figure 9:
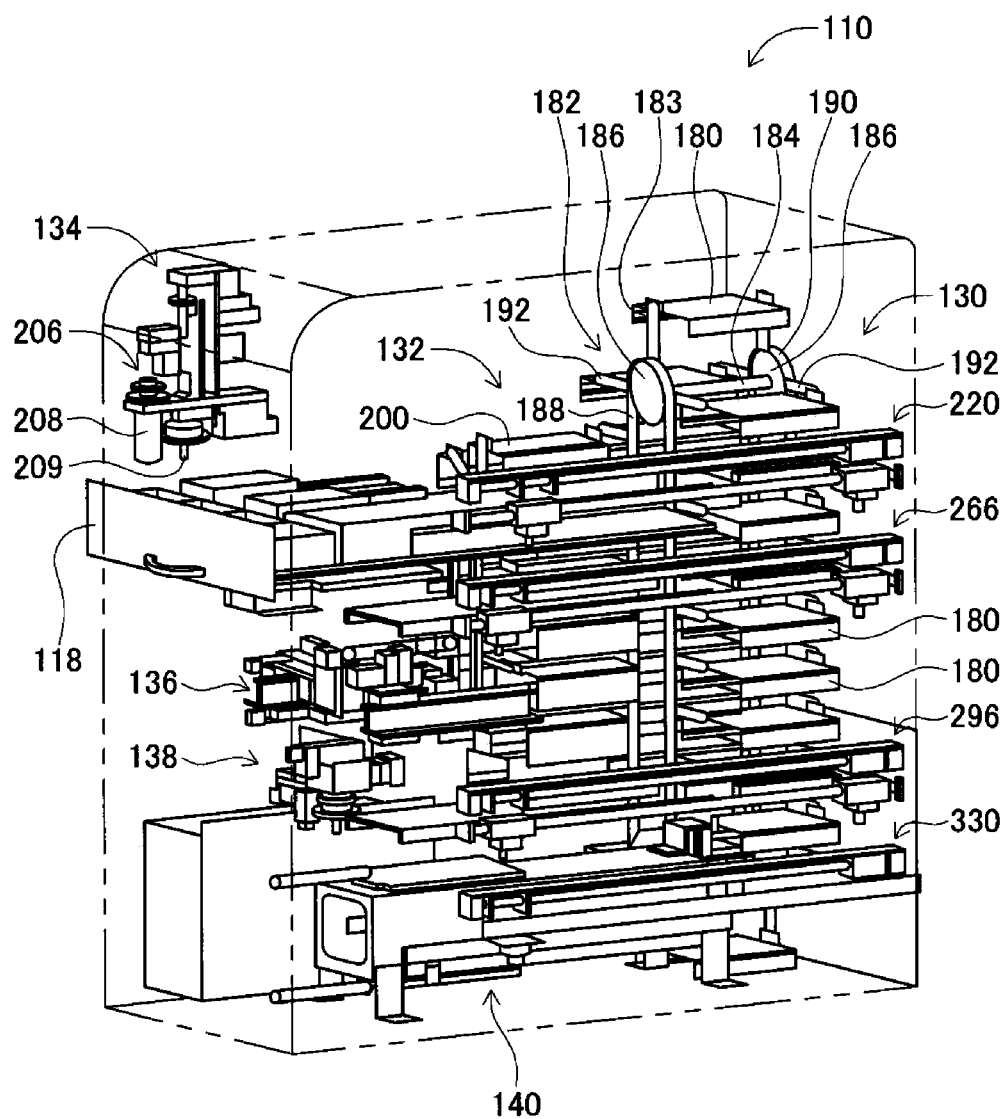
FIG. 9 is a perspective view from the front right showing the internal configuration of the nozzle management device.
Figure 10:
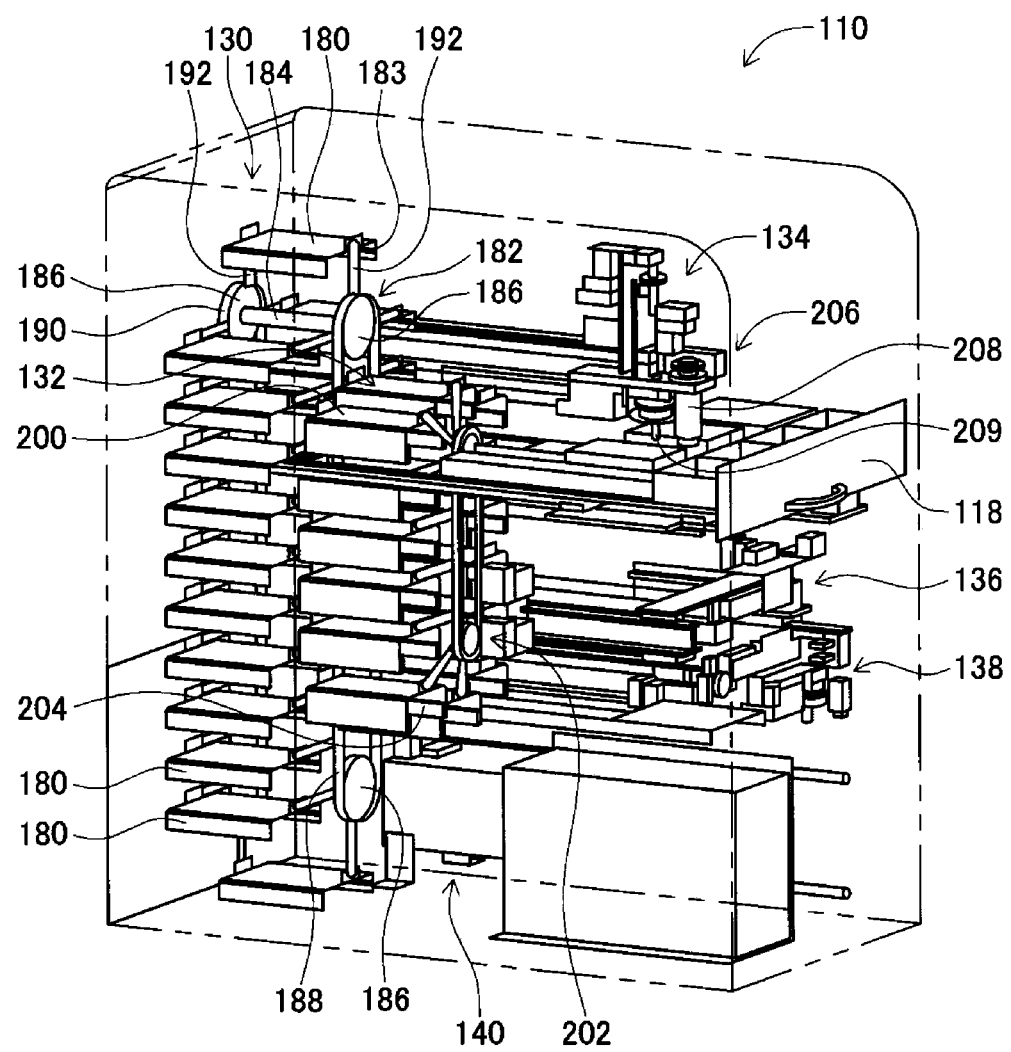
FIG. 10 is a perspective view from the front left showing the internal configuration of the nozzle management device.

As shown in FIGS. 9 and 10, each nozzle management device 110 includes pallet housing device 130, tray housing device 132, nozzle transfer device 134, first nozzle inspection device 136, second nozzle inspection device 138, and nozzle cleaning device 140. Note that, FIG. 9 is a perspective view showing the internal configuration of nozzle management device 110 as seen from the front-right of nozzle management device 110; FIG. 10 is a perspective view showing the internal configuration of nozzle management device 110 as seen from the front-left of nozzle management device 110.

(a) Pallet Housing Device

Figure 11:
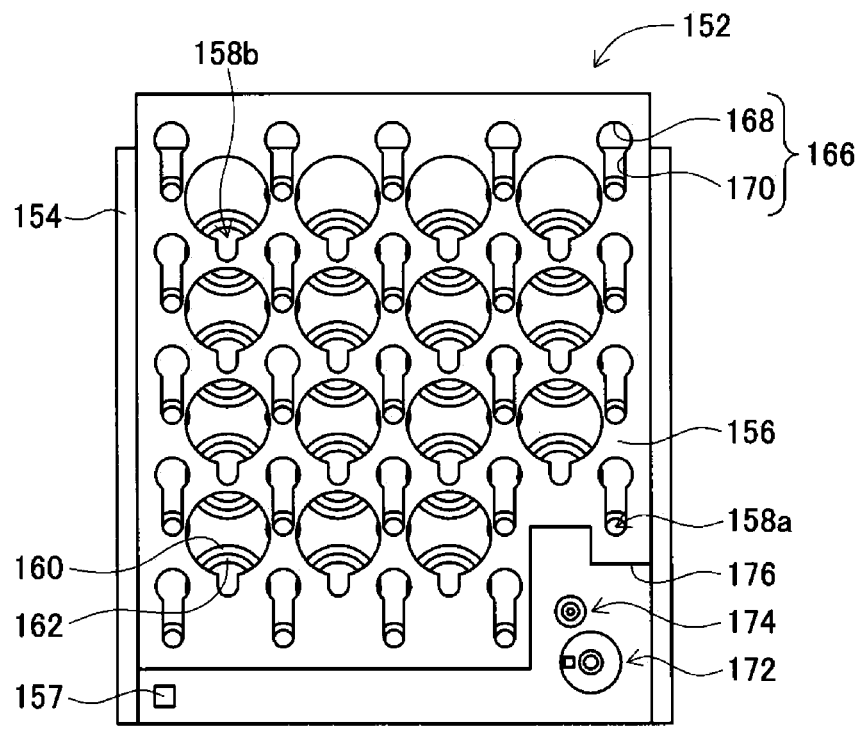
FIG. 11 is a plan view of a nozzle pallet in a partially exposed state.
Figure 12:
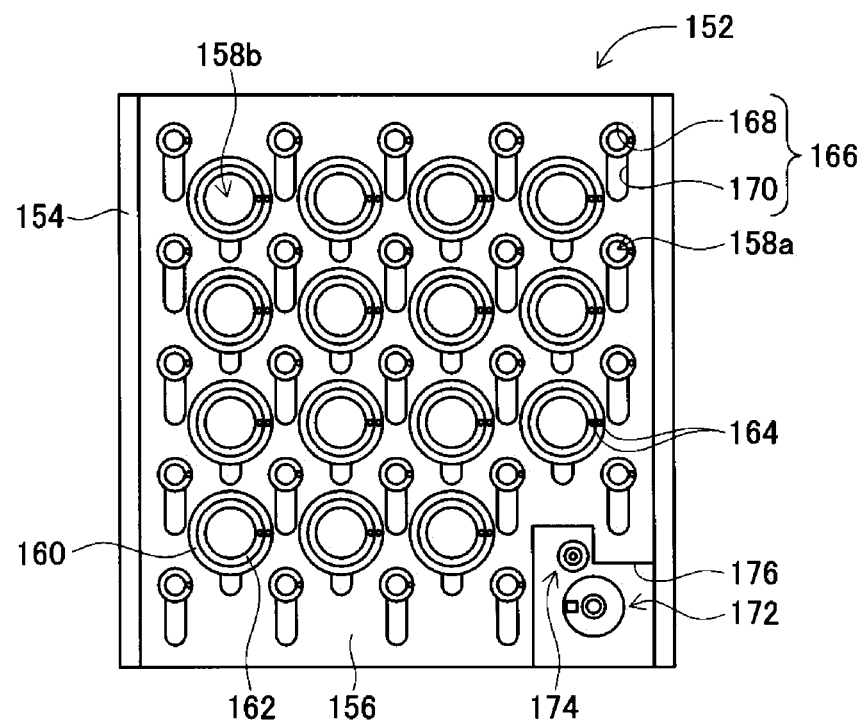
FIG. 12 is a plan view of a nozzle pallet in a fully exposed state.

Pallet housing device 130 is for housing nozzle pallets 152 shown in FIG. 11. In the same way as nozzle tray 88, nozzle pallet 152 has base plate 154 and cover plate 156; cover plate 156 is slidably provided on base plate 154. Note that, base plate 154 and cover plate 156 have roughly the same dimensions, and when cover plate 156 is slid with respect to base plate 154, 2D code 157 provided at an end of base plate 154 is exposed. Conversely, as shown in FIG. 12, when cover plate 156 entirely overlaps base plate 154, 2D code 157 is covered by cover plate 156.

Also, reference nozzle 172 and reference pipe 174 are provided at a corner section of base plate 154. Reference nozzle 172 and reference pipe 174 penetrate base plate 154, and the lower end of reference nozzle 172 and reference pipe 174 extend below base plate 154. Note that, cutout 176 is formed at a corner section of cover plate 156, such that reference nozzle 172 and reference pipe 174 are exposed even in a state in which cover plate 156 entirely overlaps base plate 154.

Figure 13:
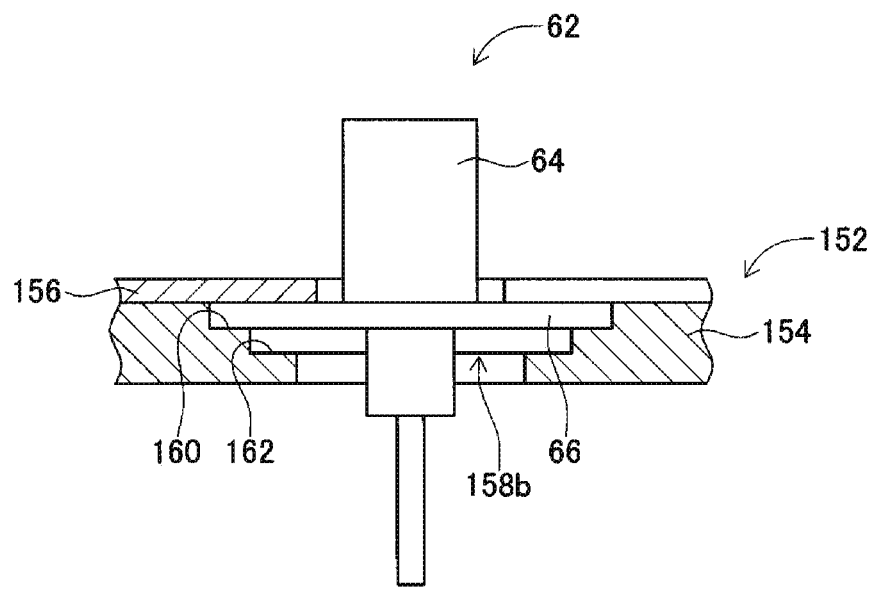
FIG. 13 is a cross section showing a nozzle pallet storing a large suction nozzle.
Figure 14:
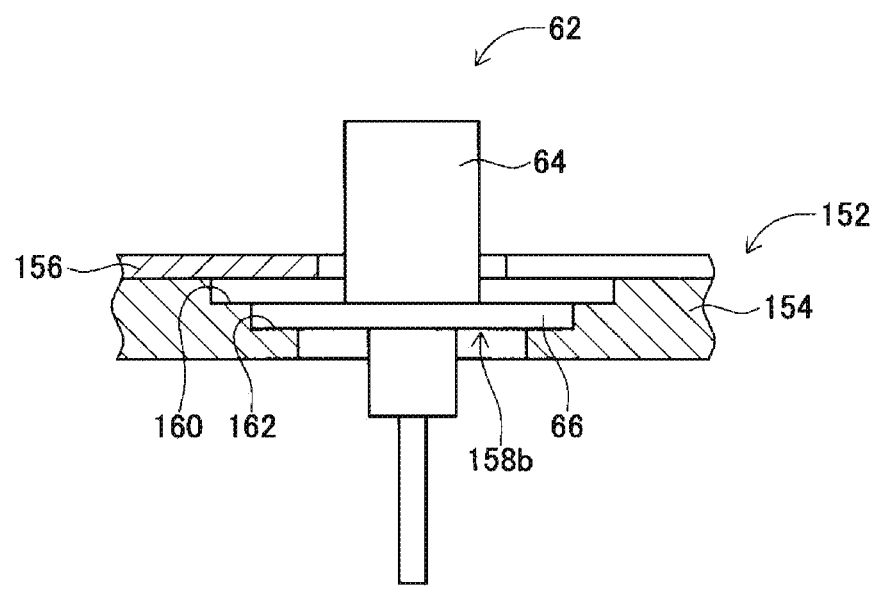
FIG. 14 is a cross section showing a nozzle pallet storing a small suction nozzle.

Multiple loading holes 158 are formed in base plate 154, and as these multiple loading holes 158, there are loading holes 158a with a small diameter and loading holes 158b with a large diameter. Loading holes 158a with a small diameter are the same shape as loading holes 96a with a small diameter of nozzle tray 88, and a suction nozzle 62 that can be loaded in a loading hole 96a is loaded into a loading hole 158a. On the other hand, loading holes 158b with a large diameter have roughly the same shape as loading holes 96b with a large diameter of nozzle tray 88, but, as shown in FIG. 11 and FIG. 13 that is a cross-section of nozzle pallet 152, loading holes 158b are stepped holes with two stepped surfaces 160 and 162. The internal diameter of first stepped surface 160 is the same as the internal diameter of loading hole 96b with a large diameter of nozzle tray 88, and as shown in FIG. 13, a suction nozzle 62 that can be loaded in a loading hole 96b is loaded onto first stepped surface 160. The internal diameter of second stepped surface 162 is smaller than the internal diameter of first stepped surface 160, and as shown in FIG. 14, a suction nozzle 62 that is smaller than a suction nozzle 62 which can be loaded onto first stepped surface 160 is loaded onto second stepped surface 162. Note that, pin (refer to FIG. 12) 164 is provided on each of stepped surfaces 160 and 162, and pin 164 engages with cutout 72 of flange 66 of suction nozzle 62.

Also, holes 166 are formed in cover plate 156 to correspond to the multiple loading holes 158 of base plate 154. Hole 166 is the same shape as hole 102 of nozzle tray 88 and is configured from circular hole section 168 and slot section 170. Thus, in the same way as with nozzle tray 88, switching between a partially exposed state and an entirely exposed state is possible with nozzle pallet 152.

In detail, in the entirely exposed state, as shown in FIG. 12, stepped surface 160 and the like of loading hole 158 is fully exposed, and it is possible to load a suction nozzle 62 in loading hole 158, and to remove a suction nozzle 62 from loading hole 158. On the other hand, in the partially exposed state, as shown in FIG. 11, a portion of stepped surface 160 and the like of loading hole 158 is covered by cover plate 156, and it is not possible to load a suction nozzle 62 in loading hole 158, or to remove a suction nozzle 62 from loading hole 158. However, in the partially exposed state, as shown in FIGS. 13 and 14, body pipe 64 of suction nozzle 62 loaded in loading hole 158 extends above cover plate 156 from slot section 170.

Also, cover plate 156 can be slid with respect to base plate 154 between the entirely exposed state and the partially exposed state, and is biased in the direction of the partially exposed state by a spring (not shown). Thus, usually, the housing of suction nozzles 62 into nozzle pallet 152 and the removal of suction nozzles 62 from nozzle pallet 152 is prohibited. However, in the same way as for nozzle tray 88, by sliding cover plate 156 against the elastic force of the spring in the direction leading to the entirely exposed state, the housing of suction nozzles 62 into nozzle pallet 152, and the removal of suction nozzles 62 from nozzle pallet 152, are allowed.

Pallet housing device 130 is for housing nozzle pallets 152 with the above configuration. As shown in FIGS. 9 and 10, pallet housing device 130 has multiple pallet carriers 180 and a carrier circulating mechanism 182. Pallet carrier 180 has the shape of a channel, that is, the cross-section of pallet carrier 180 forms a U-shape, and pallet carrier 180 is provided such that the opening of the channel shape faces downwards. Rails 183 are formed on internal surfaces of pallet carrier 180, and a nozzle pallet 152 is held by the rails 183. Note that, a nozzle pallet 152 is loaded on a pallet carrier 180 by being inserted from the front of the pallet carrier 180; a nozzle pallet 152 is removed from a pallet carrier 180 by being pulled forwards.

Carrier circulating mechanism 182 has a pair of sprocket axes 184; the pair of sprocket axes 184 are provided at the top and bottom extending in a front/rear direction. A sprocket 186 is attached at each end of each sprocket axis 184. The front sprockets 186 of the pair of sprocket axes 184 are linked to each other by chain 188; the rear sprockets 186 of the pair of sprocket axes 184 are linked to each other by chain 190.

Multiple brackets 192 are attached to chains 188 and 190 and each bracket 192 extends outwards perpendicularly from chain 188 or 190. Pallet carrier 180 is rotatably attached to an end of bracket 192 attached to chain 188 and an end of bracket 192 attached to chain 190. Sprocket axes 184 are controllably rotated by the driving of an electromagnetic motor (not shown). According to this kind of configuration, multiple pallet carriers 180, that is, nozzle pallets 152 held on pallet carriers 180, are circulated in an up/down direction inside nozzle management device 112 by carrier circulating mechanism 182. Note that, during circulating, pallet carriers 180 are always maintained in a state in which the opening of the channel shape is facing downwards, thus nozzle pallets 152 held in pallet carriers 180 are circulated always in a horizontal state.

(b) Tray Housing Device

Tray housing device 132 is for housing nozzle trays 88 and is provided in front of pallet housing device 130. Tray housing device 132 has multiple tray carriers 200 and a carrier circulating mechanism 202. Tray carrier 200, in the same way as pallet carrier 180, has the shape of a channel, and tray carrier 200 is provided such that the opening of the channel shape faces downwards. Also, nozzle tray 88 is stored in tray carrier 200 by rails 204 formed on internal surfaces of tray carrier 200. Note that, nozzle tray 88 is loaded on tray carrier 200 by being inserted from the front of the tray carrier 200; nozzle tray 88 is removed from tray carrier 200 by being pulled forwards.

Carrier circulating mechanism 202, in the same way as carrier circulating mechanism 182, has sprocket axes, sprockets, chains, brackets (symbols omitted), and the like, and operates in the same way as carrier circulating mechanism 182. Thus, multiple tray carriers 200, that is, nozzle trays 88 held on tray carriers 200, are circulated in an up/down direction inside nozzle management device 110 by carrier circulating mechanism 202. Note that, during circulating, tray carriers 200 are always maintained in a state in which the opening of the channel shape is facing downwards, thus nozzle trays 88 held in tray carriers 200 are circulated always in a horizontal state.

(c) Nozzle Transfer Device

Figure 15:
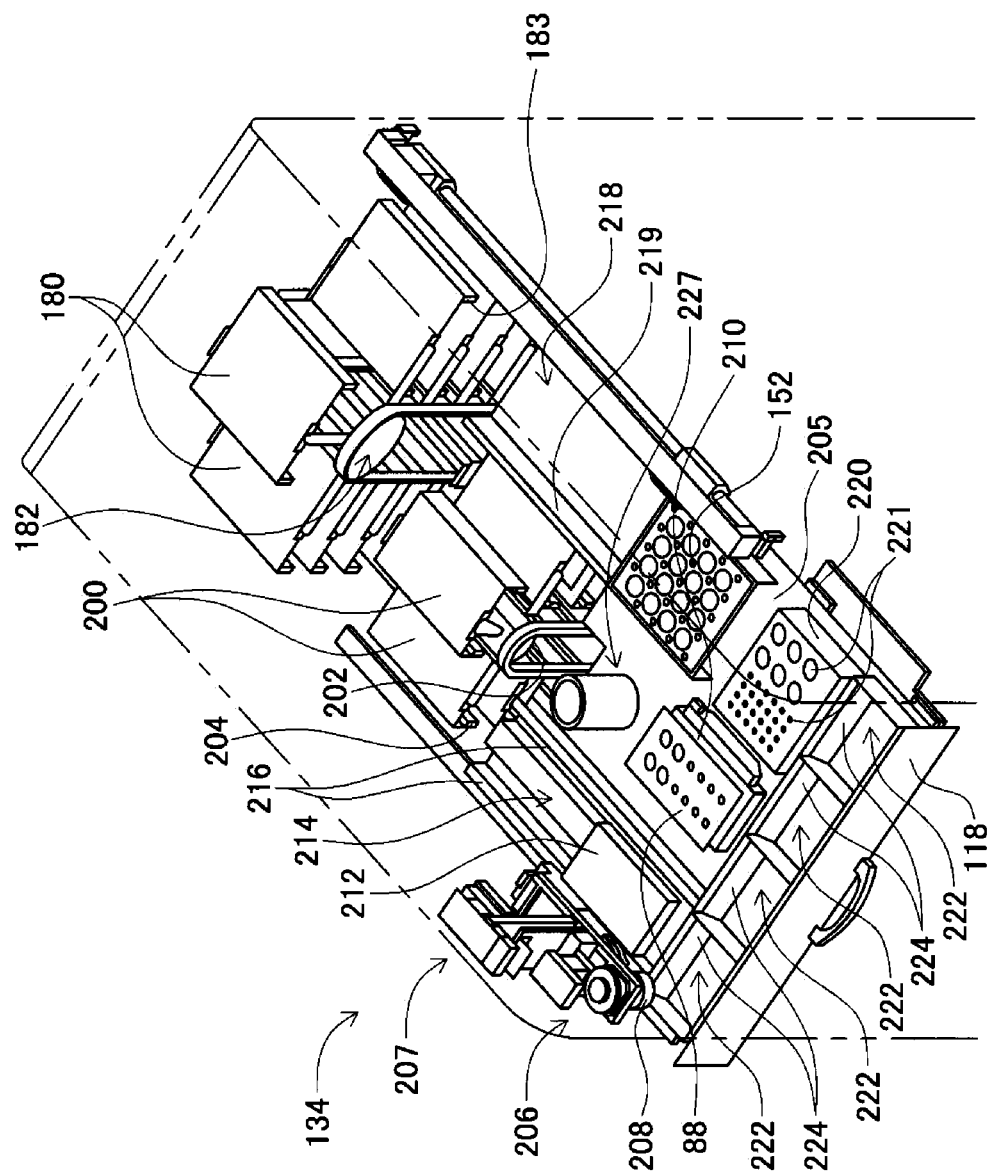
FIG. 15 is a perspective view showing a nozzle transfer device provided in the nozzle management device.

Nozzle transfer device 134 is for transferring suction nozzles 62 between nozzle tray 88 and nozzle pallet 152, and as shown in FIG. 15, is provided on table 205 inside drawer 118. Nozzle transfer device 134 has a transfer head 206 and a head moving device 207. Camera 208 facing downwards and holding chuck (refer to FIGS. 9 and 10) 209 for holding a suction nozzle 62 are provided on a lower surface of transfer head 206. Also, head moving device 207 is an XYZ-type moving device that moves transfer head 206 forwards/backwards, left/right, and up/down above table 205. Further, head moving device 207 is equipped with a rotating device (not shown) for rotating holding chuck 209 around its axis, such that suction nozzle 62 held by holding chuck 209 is able to be rotated.

Also, fixed stage 210 and movable stage 212 for setting nozzle tray 88 are provided on table 205 inside drawer 118. Fixed stage 210 is fixed to table 205. On the other hand, movable stage 212 is slid backwards/forwards by stage moving mechanism 214. Stage moving mechanism 214 includes rails 216 provided on table 205 extending in a front/rear direction, and controllably slides movable stage 212 along rails 216. The rear end of rails 216 links with rails 204 of tray carrier 200 circulated to a specified position by carrier circulating mechanism 202. Thus, by sliding movable stage 212, it is possible to house a nozzle tray 88 set on movable stage 212 in tray carrier 200, and to set a nozzle tray 88 housed in tray carrier 200 on movable stage 212.

Also, a plate moving mechanism (not shown) for moving cover plate 92 in the direction leading to the entirely exposed state with respect to the set nozzle tray 88 is provided on fixed stage 210 and movable stage 212. Note that, in the diagram, a nozzle tray 88 is shown set on fixed stage 210.

Also, first pallet moving mechanism 218 for moving nozzle pallet 152 between a pallet carrier 180 circulated to a specified position by carrier circulating mechanism 182 and a position at which transfer of suction nozzles by nozzle transfer device 134 is possible (hereinafter sometimes referred to as "nozzle transfer position") is provided on table 205 inside drawer 118. First pallet moving mechanism 218 includes rails 219 provided on table 205 extending in a front/rear direction, and controllably slides nozzle pallet 152 along rails 219. The rear end of rails 219 links with rails 183 of pallet carrier 180 circulated to a specified position by carrier circulating mechanism 182. Thus, it is possible to move nozzle pallet 152 between a pallet carrier 180 circulated to a specified position by carrier circulating mechanism 182 and the nozzle transfer position. Note that, in the diagram, a nozzle pallet 152 is shown moved to the nozzle transfer position.

Transfer plate 220 is provided in front of nozzle pallet 152 moved to the nozzle transfer position. Multiple loading holes 221 with the same shape as loading holes 158 formed in base plate 154 of nozzle pallet 152 are formed in transfer plate 220. In the same way as loading holes 158, as multiple loading holes 221, there are loading holes 221 with a large diameter and loading holes 221 with a small diameter such that suction nozzles 62 of various sizes can be loaded.

Figure 16:
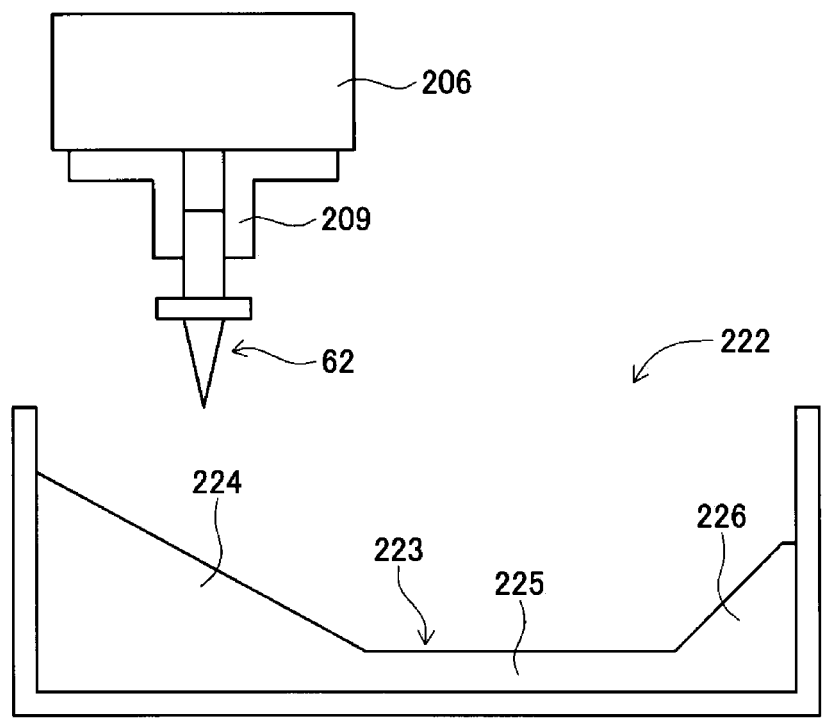
FIG. 16 is a cross section showing a discard box.

Also, discard box 222 is provided on the front section of table 205 inside drawer 118. Discard box 222 is divided into four spaces and suction nozzles which have been determined to be abnormal, that is defective nozzles, are divided and discarded into the four spaces. Note that, as shown in FIG. 16, cushioning sheet 223 is arranged on the bottom surface of each discard box 222. Cushioning sheet 223 is formed from cushioning material and covers the entire surface of discard box 222. Cushioning sheet 223 is configured from first inclined section 224, flat section 225, and second inclined section 226. As shown in FIG. 15, first inclined section 224 is positioned inside discard box 222 at the drawer 118 end, and is an inclined surface that slopes down towards the outside of drawer 118. Also, as shown in FIG. 16, second inclined section 226 is positioned at the end opposite to first inclination 224, and is a surface that slopes down towards first inclined section 224. Further, flat section 225 is a flat surface that connects the lower end of first inclined section 224 and the lower end of second inclined section 226.

Figure 17:
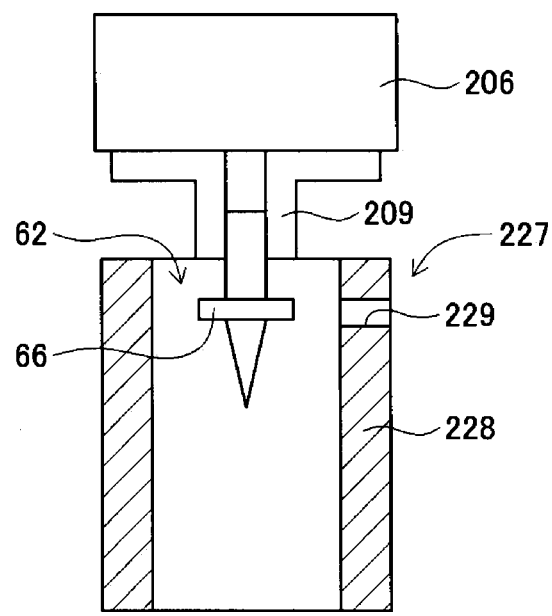
FIG. 17 is a cross section showing, a blow device.

As shown in FIG. 15, blow device 227 is arranged next to nozzle pallet 152 moved to the nozzle transfer position. Blow device 227 is for drying suction nozzle 62, and as shown in FIG. 17, is configured from tubular main body section 228, air ejection hole 229 formed in a side surface of main body section 228, and an air ejection device (not shown) connected to air ejection hole 229.

(d) First nozzle inspection device First nozzle inspection device 136 is a device that performs inspection of the tip of suction nozzle 62, that is inspection of the state of suction tube 68 (hereinafter sometimes referred to as "tip inspection"), and inspection of the force required for the tip of suction nozzle 62 to retreat, that is inspection of the force required for suction tube 68 to retreat into body pipe 64 (hereinafter sometimes referred to as "retreat force inspection"), and is provided below nozzle transfer device 134.

Figure 18:
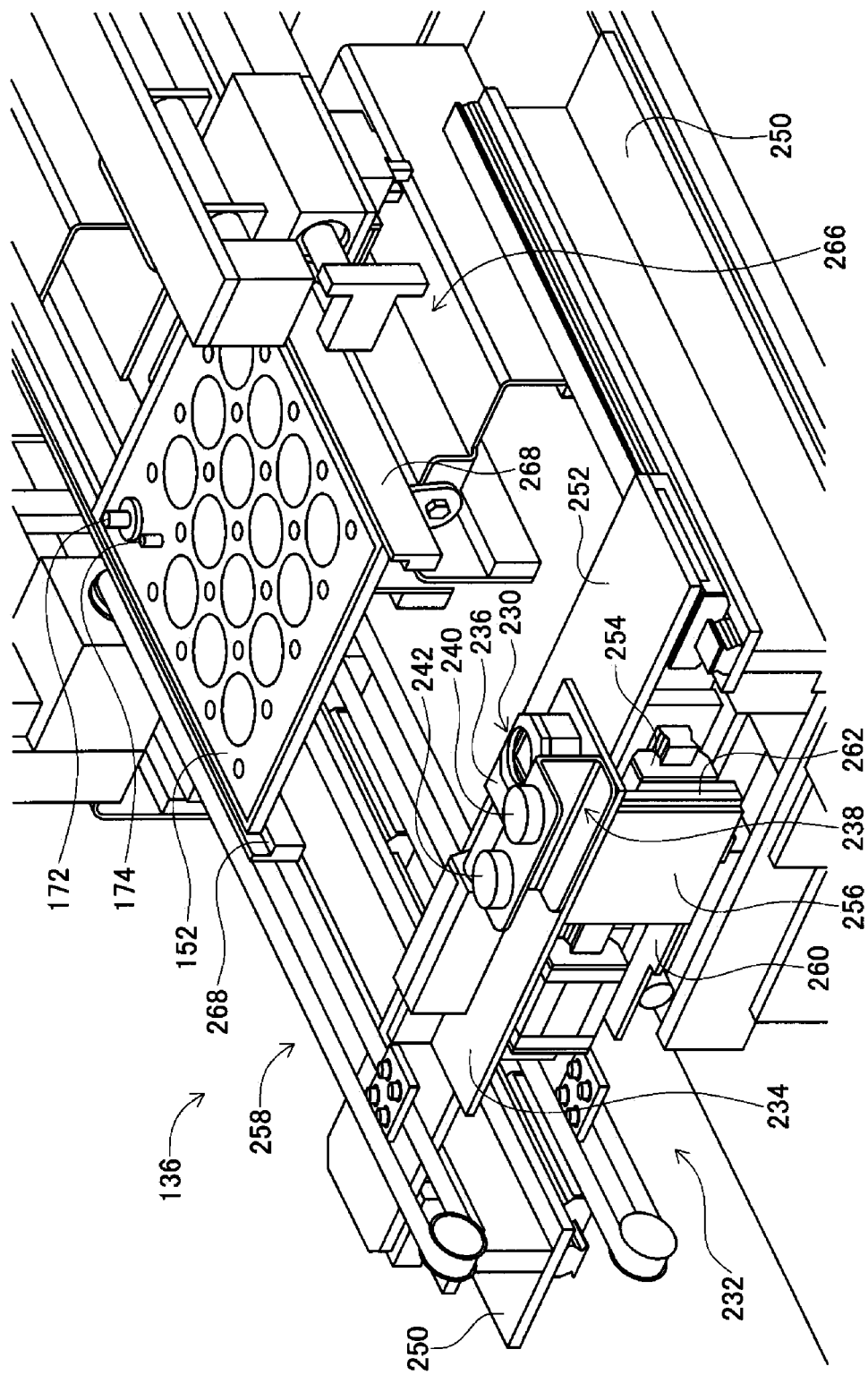
FIG. 18 is a perspective view showing a first nozzle inspection device provided in the nozzle management device.

As shown in FIG. 18, first nozzle inspection device 136 includes inspection unit 230 and unit moving device 232. Inspection unit 230 includes base 234, camera device 236, and load measuring device 238. Camera device 236 is provided facing up on base 234. Load measuring device 238 includes load cell 240 and metal contact tool 242; load cell 240 and metal contact tool 242 are provided in an exposed state on base 234.

Unit moving device 232 includes fixed beam 250, movable beam 252, first slider 254, and second slider 256. Fixed beam 250 is provided on the frame of nozzle management device 110 extending in a front/rear direction. Movable beam 252 is held on fixed beam 250 extending in a left/right direction such that movable beam 252 can be slid forwards/backwards. Movable beam 252 is moved to any position in a forwards/backwards direction by the operation of first moving mechanism 258. First slider 254 is held on movable beam 252 so as to be slidable in a left/right direction, and is moved to any position in a left/right direction by the operation of second moving mechanism 260. Second slider 256 is held on first slider 254 so as to be slidable in an up/down direction, and is moved to any position in an up/down direction by the operation of third moving mechanism 262. Base 234 of inspection unit 230 is fixed to the top of second slider 256. Thus, unit moving device 232 functions as an XYZ-type moving device that moves inspection unit 230 to any position in up/down, left/right, and forwards/backwards directions.

Also, second pallet moving mechanism 266 is provided above first nozzle inspection device 136. Second pallet moving mechanism 266 is a mechanism for moving nozzle pallet 152 between a pallet carrier 180 circulated to a specified position by carrier circulating mechanism 182, and a position at which tip inspection and retreat force inspection can be performed by first nozzle inspection device 136 (hereinafter sometimes referred to as "first inspection position"). In detail, second pallet moving mechanism 266 includes rails 268 extending in a front/rear direction, and controllably slides nozzle pallet 152 along rails 268. The rear end of rails 268 links with rails 183 of pallet carrier 180 circulated to a specified position by carrier circulating mechanism 182. Thus, it is possible to move nozzle pallet 152 between a pallet carrier 180 circulated to a specified position by carrier circulating mechanism 182 and the first inspection position. Note that, in the diagram, a nozzle pallet 152 is shown moved to the first inspection position.

(e) Second Nozzle Inspection Device

Second nozzle inspection device 138 is a device that performs inspection of the amount of air which flows inside suction nozzle 62 (hereinafter sometimes referred to as "air flow amount inspection"), and reading and inspection of 2D code 74 provided on flange 66 of suction nozzle 62 (hereinafter sometimes referred to as "code reading inspection"), and is provided below first nozzle inspection device 136.

Figure 19:
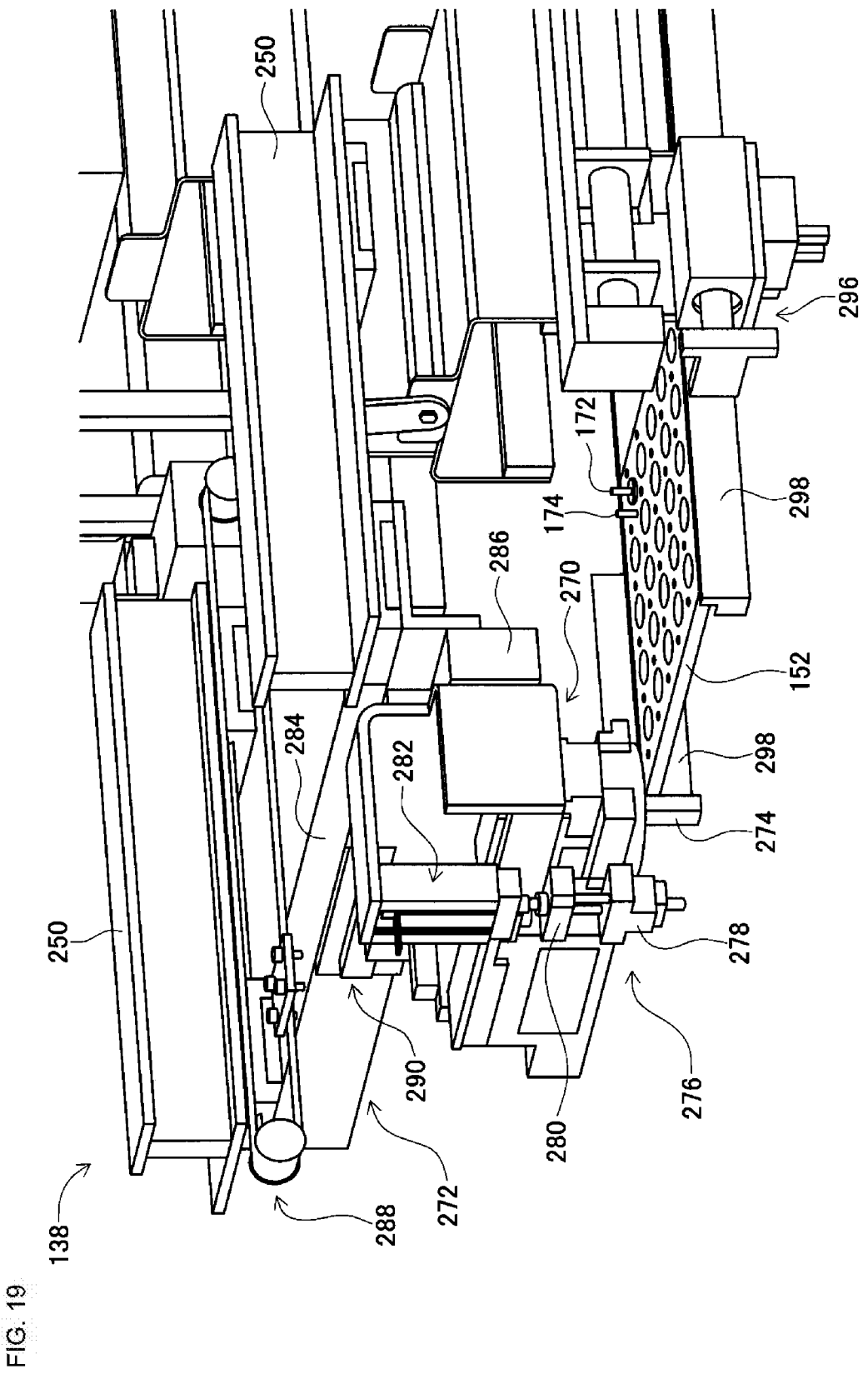
FIG. 19 is a perspective view showing a second nozzle inspection device provided in the nozzle management device.

As shown in FIG. 19, second nozzle inspection device 138 includes inspection head 270 and head moving device 272. Inspection head 270 includes camera 274 and air supply device 276. Camera 274 is attached to the lower end of inspection head 270 in a state facing down. Air supply device 276 includes air joint 278, air pressure sensor 280, and joint raising/lowering mechanism 282. Air joint 278 is connected to body pipe 64 of suction nozzle 62 when performing air flow amount inspection, and supplies air to suction nozzle 62 during air flow amount inspection via air joint 278. Air pressure sensor 280 is provided on the upper end of air joint 278 and measures the pressure of air supplied to suction nozzle 62. Joint raising/lowering mechanism 282 raises/lowers air joint 278 together with air pressure sensor 280.

Head moving device 272 includes movable beam 284 and slider 286. Movable beam 284 is held on fixed beam 250 of the above first nozzle inspection device 136 extending in a left/right direction and such that movable beam 284 can be slid forwards/backwards. Movable beam 284 is moved to any position in a forwards/backwards direction by the operation of first moving mechanism 288. Slider 286 is held on movable beam 284 so as to be slidable in a left/right direction, and is moved to any position in a left/right direction by the operation of second moving mechanism 290. Inspection head 270 is fixed to a side surface of slider 286. Thus, head moving device 272 functions as an XY-type moving device that moves inspection head 270 to any position in up/down, and left/right directions.

Also, third pallet moving mechanism 296 is provided below second nozzle inspection device 138. Third pallet moving mechanism 296 is a mechanism for moving nozzle pallet 152 between a pallet carrier 180 circulated to a specified position by carrier circulating mechanism 182, and a position at which flow amount inspection and code reading inspection can be performed by second nozzle inspection device 138 (hereinafter sometimes referred to as "second inspection position"). In detail, third pallet moving mechanism 296 includes rails 298 extending in a front/rear direction, and controllably slides nozzle pallet 152 along rails 298. The rear end of rails 298 links with rails 183 of pallet carrier 180 circulated to a specified position by carrier circulating mechanism 182. Thus, it is possible to move nozzle pallet 152 between a pallet carrier 180 circulated to a specified position by carrier circulating mechanism 182 and the second inspection position. Note that, in the diagram, a nozzle pallet 152 is shown moved to the second inspection position.

(f) Nozzle Cleaning Device

Figure 20:
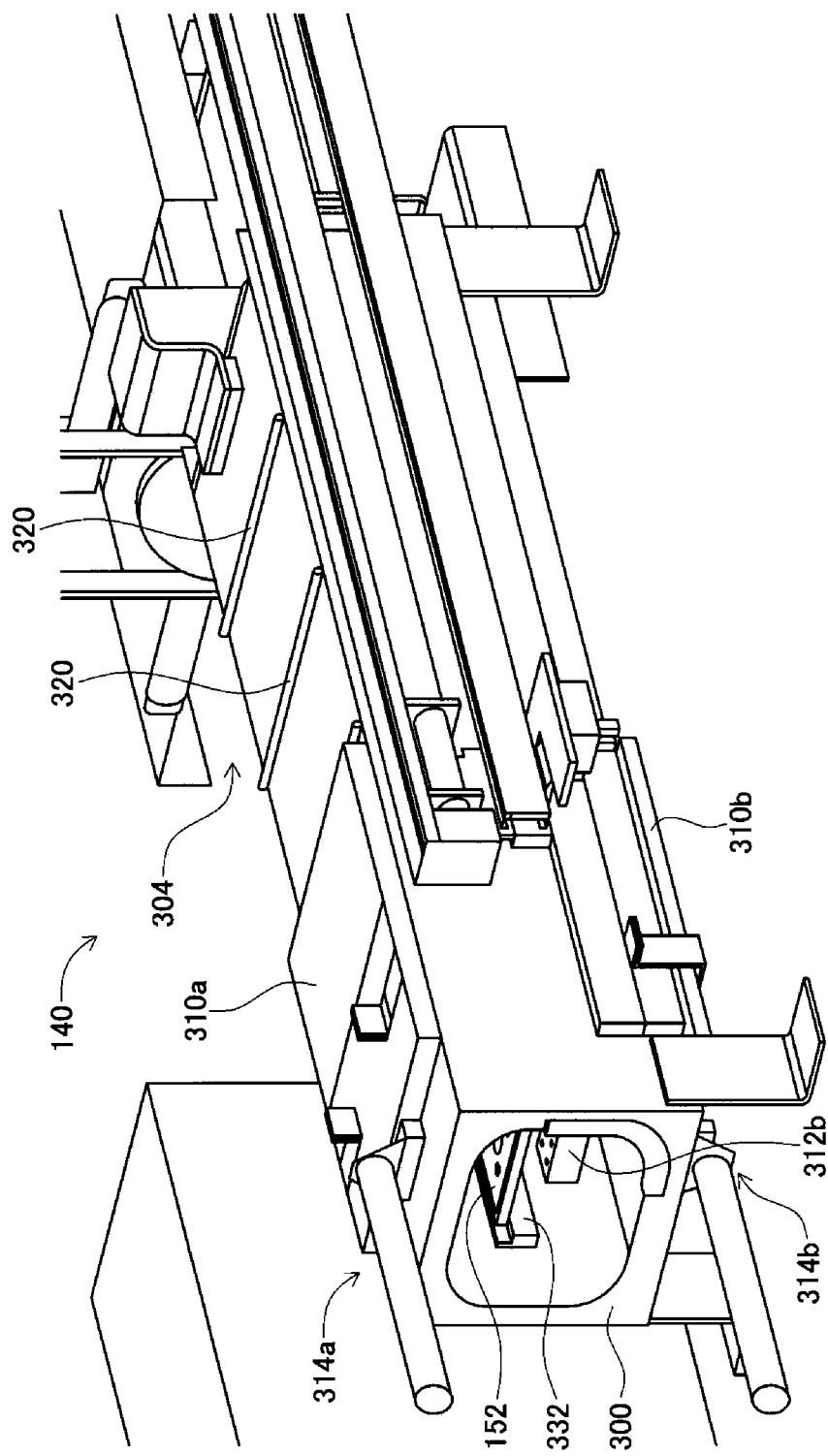
FIG. 20 is a perspective view showing a nozzle cleaning device provided in the nozzle management device.
Figure 21:
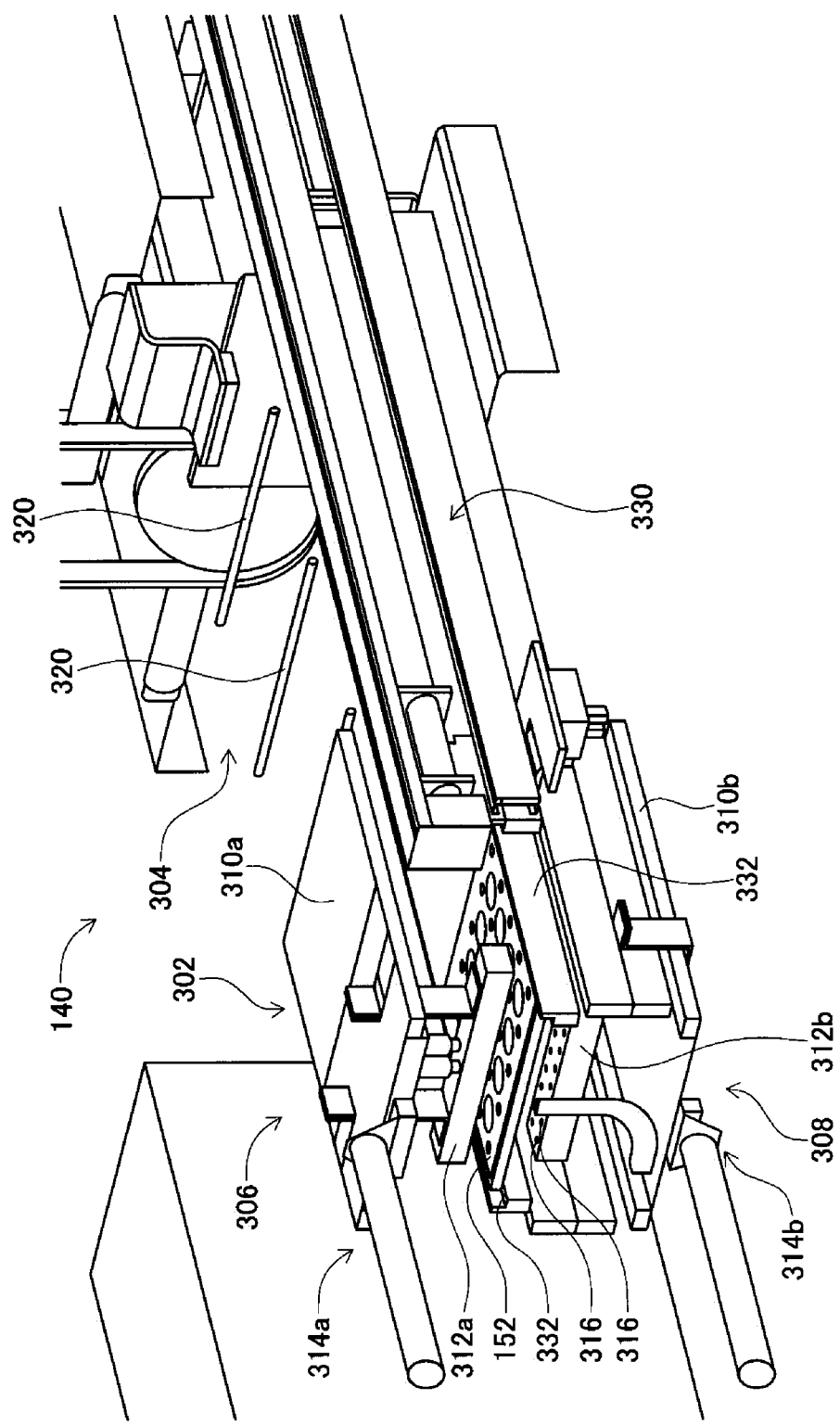
FIG. 21 is a perspective view showing the nozzle cleaning device with housing removed.

Nozzle cleaning device 140 is a device that performs cleaning and drying of suction nozzles 62 and is provided below second nozzle inspection device 138. As shown in FIG. 20, nozzle cleaning device 140 includes housing 300; cleaning and drying of suction nozzles 62 is performed inside housing 300. FIG. 21 shows nozzle cleaning device 140 without housing 300 to illustrate the configuration of nozzle cleaning device 140.

As shown in FIG. 21, nozzle cleaning device 140 includes nozzle cleaning mechanism 302 and nozzle drying mechanism 304. Nozzle cleaning mechanism 302 is configured from upper cleaning unit 306 and lower cleaning unit 308. Upper cleaning unit 306 and lower cleaning unit 308 have similar configurations and are provided facing each other in an up/down direction. Each unit 306 and 308 includes support frame 310, spray nozzle 312, and spray nozzle moving mechanism 314.

Support frame 310a of upper cleaning unit 306 is fixed to the top of housing 300; support frame 310b of lower cleaning unit 308 is fixed to the inside bottom of housing 300. Spray nozzle 312a of upper cleaning unit 306 is provided on the upper end inside housing 300 extending in a left/right direction, and is slidably supported in a front/rear direction by support frame 310a via the top of housing 300. Spray nozzle 312a is controllably slidable in a front/rear direction by spray nozzle moving mechanism 314a of upper cleaning unit 306. Spray nozzle 312b of lower cleaning unit 308 is provided on the lower end inside housing 300 extending in a left/right direction, and is slidably supported in a front/rear direction by support frame 310b via the top of housing 300. Spray nozzle 312b is controllably slidable in a front/rear direction by spray nozzle moving mechanism 314b of lower cleaning unit 308. Note that multiple spray holes (not shown) are formed in the bottom of spray nozzle 312a and multiple spray holes 316 are formed in the upper surface of spray nozzle 312b.

Nozzle drying mechanism 304 includes multiple ventilation pipes 320 provided to the rear of nozzle cleaning mechanism 302. Multiple ventilation pipes 320 are provided extending in a left/right direction on the top and bottom of housing 300. Ventilation pipes 320 are connected to a ventilation device (not shown) via a heater (not shown) such that warm air is blown through ventilation pipes 320. Also, multiple ventilation holes (not shown) are formed in ventilation pipes 320 on the attachment section to housing 300; through-holes are formed in the top and bottom of housing 300 to correspond to these ventilation holes. Thus, warm air is blown in housing 300 by nozzle drying mechanism 304.

Also, fourth pallet moving mechanism 330 is provided inside housing 300. Fourth pallet moving mechanism 330 is a mechanism for moving nozzle pallet 152 between a pallet carrier 180 circulated to a specified position by carrier circulating mechanism 182, and a position at which cleaning of suction nozzles 62 can be performed by nozzle cleaning mechanism 302 (hereinafter sometimes referred to as "cleaning position"). In detail, fourth pallet moving mechanism 330 includes rails 332 provided on inside walls of housing 300 and extending in a front/rear direction, and controllably slides nozzle pallet 152 along rails 332. The front end of rails 332 is positioned between upper cleaning unit 306 and lower cleaning unit 308. On the other hand, the rear end of rails 332 links with rails 183 of pallet carrier 180 circulated to a specified position by carrier circulating mechanism 182. Thus, it is possible to move nozzle pallet 152 between a pallet carrier 180 circulated to a specified position by carrier circulating mechanism 182 and the cleaning position. Note that, in the diagram, a nozzle pallet 152 is shown moved to the cleaning position.

Figure 22:
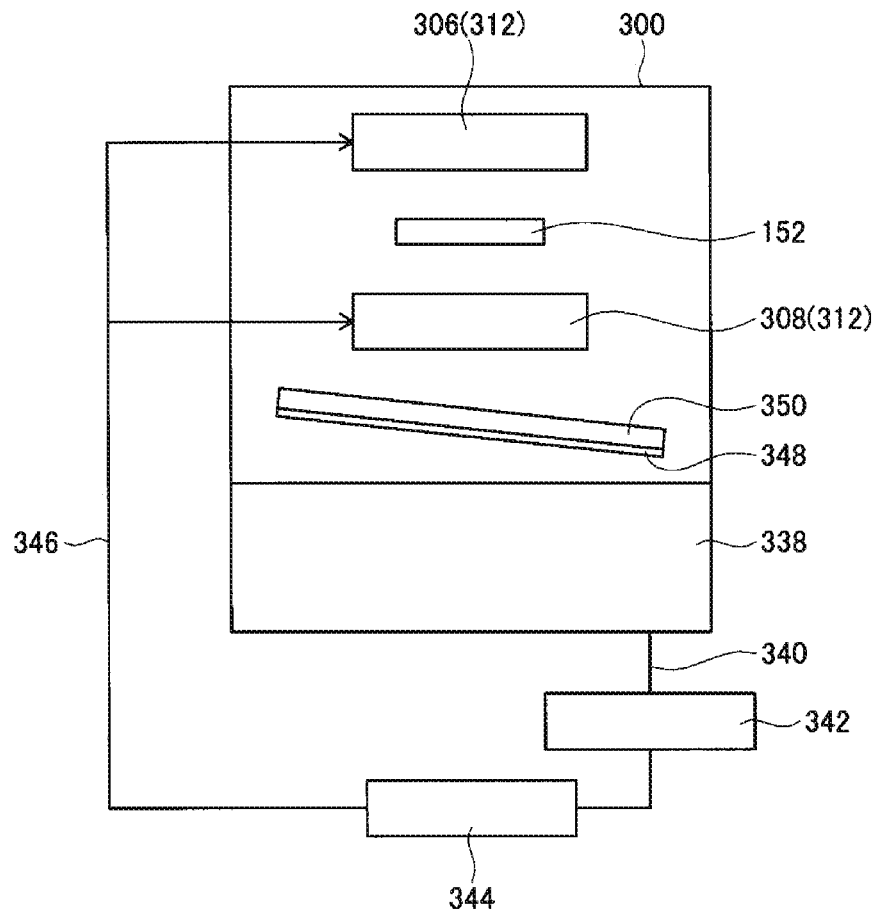
FIG. 22 schematically shows the nozzle cleaning device.

Further, the bottom surface of housing 300 functions as a water storage tank; cleaning water collected in the bottom surface of housing 300 is circulated and supplied to spray nozzles 312 of upper cleaning unit 306 and lower cleaning unit 308. In detail, as shown in FIG. 22, cleaning water 338 is collected at the bottom surface of housing 300, and an end of drainage path 340 is open in the bottom surface of housing 300. Drainage path 340 extends downwards, and filter 342 for removing impurities is provided in drainage path 340. By this, cleaning water 338 collected in the bottom surface of housing 300 flows through drainage path 340 and impurities are removed by filter 342. Here, cleaning water 338 flows due to its own weight, thus there is no need to provide a pump or the like for causing the cleaning water to flow from the bottom surface of housing 300.

Cleaning water 338 from which impurities have been removed is fed into booster pump 344 and sent to water supply path 346 by booster pump 344. Water supply path 346 is connected to spray nozzles 312 of upper cleaning unit 306 and lower cleaning unit 308, and cleaning water 338 is jetted from spray nozzles 312. Also, separating plate 348 is provided between lower cleaning unit 308 and cleaning water 338 collected in the bottom surface of housing 300. Separating plate 348 is provided in an inclined state, and sheet-form sponge 350 is affixed to the upper surface of separating plate 348. Thus, cleaning water 338 jetted from spray nozzles 312 falls onto separating plate 348. When this occurs, cleaning water 338 is prevented from bouncing by sponge 350 affixed to the upper surface of separating plate 348. Also, cleaning water 338 flows over separating plate 348 provided in an inclined state and is collected again in the bottom surface of housing 300. In this way, cleaning water 338 is circulated in nozzle cleaning device 140. Note that, separating plate 348 provided below lower cleaning unit 308 extends below nozzle drying mechanism 304.

Management of suction nozzles by the nozzle management device With the nozzle management device 110 with the above configuration, work of housing suction nozzles 62 loaded on a nozzle tray 88 into nozzle management device 110, work of inspecting suction nozzles 62 by first nozzle inspection device 136, work of inspecting suction nozzles 62 by second nozzle inspection device 138, work of cleaning/drying suction nozzles is 62, work of loading suction nozzles 62 for which inspection work and cleaning/drying work has been completed to nozzle tray 88, and work of discarding defective nozzles are performed. Described below is the operating state of nozzle management device 110 while the above work is being performed.

(a) Work of Housing Suction Nozzles in the Nozzle Management Device

During work of housing suction nozzles 62 into nozzle management device 110, as shown in FIG. 15, an operator sets a nozzle tray 88 on which suction nozzles 62 are loaded onto fixed stage 210 or movable stage 212 inside drawer 118 of nozzle management device 110. Note that, when nozzle tray 88 is set on movable stage 212, an operator may set nozzle tray 88 on movable stage 212, or a nozzle tray 88 housed in tray carrier 200 may be set on movable stage 212 by stage moving mechanism 214. Also, with nozzle management device 110, a pallet carrier 180 housing nozzle pallet 152 onto which suction nozzles 62 can be loaded is moved to a position corresponding to first pallet moving mechanism 218 by the operation of carrier circulating mechanism 182.

Continuing, nozzle pallet 152 housed in the pallet carrier 180 is moved to the nozzle transfer position by the operation of first pallet moving mechanism 218. Next, nozzle pallet 152 moved to the nozzle transfer position and nozzle tray 88 set on fixed stage 210 or movable stage 212 is made into the fully exposed state by a plate moving mechanism. Continuing, transfer head 206 is moved above nozzle tray 88 and nozzle pallet 152 by the operation of head moving device 207, and each 2D code 94 and 157 on nozzle tray 88 and nozzle pallet 152 is imaged by camera 208. Thus, characteristic information such as an ID number of nozzle tray 88 and nozzle pallet 152 is obtained.

Continuing, transfer head 206 moves above nozzle tray 88 by operation of head moving device 207 and 2D code 74 of the suction nozzle 62 which is the transfer target is imaged by camera 208. By this, characteristic information such as an ID number of suction nozzle 62 which is the transfer target is obtained. Then, suction nozzle 62 which is the transfer target is held by holding chuck 209.

When suction nozzle 62 which is the transfer target is held by holding chuck 209, transfer head 206 moves above nozzle pallet 152 which is the transfer destination of suction nozzle 62 by the operation of head moving device 207, and suction nozzle 62 which is held is transferred to a loading hole 158 of nozzle pallet 152. By this, suction nozzle 62 is transferred from nozzle tray 88 to nozzle pallet 152. Note that, during transfer of suction nozzle 62, a link between the ID number of nozzle pallet 152 which is the transfer destination, the ID number of the transferred suction nozzle 62, and the loading position in the nozzle pallet 152 is created and stored.

Also, when suction nozzle 62 is transferred, if there are no empty loading holes 158 in the transfer destination nozzle pallet 152, that is a suction nozzle 62 has been loaded in all the loading holes 158, the holding chuck 209 which is holding a suction nozzle 62 is moved above transfer plate 220 by the operation of head moving device 207, and suction nozzle 62 is provisionally loaded in loading hole 221 of loading plate 220.

When transfer of suction nozzles 62 to nozzle pallet 152 is complete, that nozzle pallet 152 is housed in pallet carrier 180 by the operation of first pallet moving mechanism 218.

Thus, the work of housing suction nozzles 62 in nozzle management device 110 is completed.

Note that, nozzle tray 88 which becomes empty due to the loading of suction nozzles 62 onto nozzle pallet 152 is collected by the operator from fixed stage 210 or movable stage 212. Alternatively, if nozzle tray 88 is set on movable stage 212, nozzle tray 88 which becomes empty due to the loading of suction nozzles 62 onto nozzle pallet 152 may be housed in tray carrier 200 by the operation of stage moving mechanism 214.

(b) Work of Inspecting Suction Nozzles by the First Nozzle Inspection Device

During inspection work of suction nozzles 62, when inspection of tip sections is performed by first nozzle inspection device 136, a pallet carrier 180 housing a prescribed nozzle pallet 152 is moved, as shown in FIG. 18, to a position corresponding to second pallet moving mechanism 226 by the operation of carrier circulating mechanism 182. Suction nozzles 62 which are targets for inspection are housed in the prescribed nozzle pallet 152.

Continuing, nozzle pallet 152 housed in the pallet carrier 180 is moved to the first inspection position by the operation of second pallet moving mechanism 266. Then, camera device 236 of inspection unit 230 is moved below suction nozzle 62 which is the inspection target by unit moving device 232, and suction tube 68 of suction nozzle 62 which is the inspection target is imaged by camera device 236. Thus, image data of suction tube 68 of the suction nozzle 62 is obtained and the state of suction tube 68 is inspected based on the image data. If a problem such as a bent suction tube 68, a chipped tip of suction tube 68, a deformed suction tube 68, and so on is found by inspection based on the image data, examination is performed by first nozzle inspection device 136.

In detail, in a case in which a problem with suction tube 68 is found by inspection based on the image data, camera device 236 is moved below reference pipe 174 of nozzle pallet 152 by unit moving device 232, and reference pipe 174 is imaged by camera device 236. Then, the state of reference pipe 174 is inspected based on the acquired image data. A normal condition suction tube 68 is attached to the lower end of reference pipe 174, so if first nozzle inspection device is operating correctly, the suction tube 68 of reference pipe 174 will naturally be determined to be normal in the inspection based on the image data of reference pipe 174. Thus, in a case in which a problem is found with suction tube 68 by inspection based on image data of suction nozzle 62 which is the inspection target, and suction nozzle 68 of reference pipe 174 is determined to be normal by inspection based on the image data of reference pipe 174, the problem with suction tube 68 of suction nozzle 62 which is the target for inspection is confirmed and suction nozzle 62 which is the target for inspection is recognized as a defective nozzle. Conversely, in a case in which a problem is found with suction tube 68 by inspection based on image data of suction nozzle 62 which is the inspection target, and suction nozzle 68 of reference pipe 174 is determined to have a problem by inspection based on the image data of reference pipe 174, it is taken that first nozzle inspection device 136 cannot perform inspection properly, and suction nozzle 62 which is the target for inspection is not recognized as a defective nozzle.

Also, when retreating force inspection is performed by first nozzle inspection device 136, the tip section of suction tube 68 of suction nozzle 62 is made to contact load cell 240, and load cell 240 is moved such that suction tube 68 of suction nozzle 62 retreats inside body pipe 64. Here, the load detected by load cell 240 is the load arising when relative movement occurs between body pipe 64 and suction tube 68, that is, the retreating load of suction tube 68 into body pipe 64. Because this load is relatively small, a load cell 240 with high sensitivity is used, thus load cell 240 is easily damaged in a case in which there is no relative movement between body pipe 64 and suction tube 68.

In detail, for example, there are cases in which there is virtually no relative movement between body pipe 64 and suction tube 68 if body pipe 64 and suction tube 68 become stuck by an impurity or the like getting inside suction nozzle 62. For this kind of suction nozzle 62, if a load cell 240 with a measurement range of 0 to 100 gf is contacted against suction nozzle 62, because there is virtually no relative movement between body pipe 64 and suction tube 68, in a case in which the load from load cell 240 being moved is 100 gf or greater, a load of 100 gf or greater is applied to load cell 240, meaning that load cell 240 may be damaged. Thus, it is necessary to move load cell 240 with a load smaller than 100 gf. However, inspection unit 230 in which load cell 240 is provided is relatively large and heavy, thus the inertia is large when moving inspection unit 230, and it is difficult to move inspection unit 230 with a load smaller than 100 gf.

Considering this problem, with the first nozzle inspection device 136, relative movement of body pipe 64 and suction tube 68 of suction nozzle 62 is checked using metal contact tool 242, with retreat force inspection using load cell 240 being performed on suction nozzles 62 for which the relative movement state of body pipe 64 and suction tube 68 is good. Specifically, metal contact tool 242 provided on inspection unit 230 is moved below suction nozzle 62 that is the target for inspection by unit moving device 232, and inspection unit 230 is moved up such that metal contact tool 242 contacts the lower end of suction tube 68 of suction nozzle 62. Here, inspection unit 230 is moved up such that suction tube 68 of suction nozzle 62 retreats inside body pipe 64.

By inspection unit 230 being moved up, suction tube 68 is pushed up by metal contact tool 242, and in a case where suction tube 68 has retreated inside body pipe 64 by a first set amount, it is determined that the state of the relative movement between body pipe 64 and suction tube 68 is good. On the other hand, if suction tube 68 does not retreat inside body pipe 64 by the first set amount even though suction tube 68 is being pushed up by metal contact tool 242, body pipe 64 and suction tube 68 are stuck to each other, and it is determined that the relative movement between them is not good.

Note that, metal contact tool 242 that pushes suction tube 68 of suction nozzle 62 has a rigid body that does not break easily, thus it is possible to move inspection unit 230 up with a fairly large load. However, damage to suction nozzle 62 should be avoided in a case in which body pipe 64 and suction tube 68 are stuck such that relative movement does not occur between them, and the load with which inspection unit 230 is moved up is set to be smaller than the load at which damage occurs to suction nozzle 62 when suction nozzle 62 is pushed in an axis line direction.

The retreat force for a suction nozzle 62 determined to have a good state of relative movement between body pipe 64 and suction tube 68 using metal contact tool 242 is measured using load cell 240. However, for suction nozzle 62 for which it is judged that the state of relative movement between body pipe 64 and suction tube 68 is not good, measurement of the retreat force using load cell 240 is not performed. By this, it is possible to avoid measuring suction nozzles 62 for which there is a tendency for the load to exceed the measurement range of load cell 240, and it is possible to avoid damaging load cell 240. Also, because a relatively large load is applied to suction nozzle 62 in the relative movement direction of body pipe 64 and suction tube 68, there are cases in which, when body pipe 64 and suction tube 68 are stuck by impurities or the like, the impurities are removed due to the heavy load. That is, there are cases in which the heavy load results in relative movement becoming possible again for suction nozzles for which there was virtually no relative movement between body pipe 64 and suction tube 68.

Next, in a case in which it is determined that the state of relative movement between body pipe 64 and suction tube 68 is good, load cell 240 provided on inspection 230 is moved below that suction nozzle 62 by unit moving device 232, and inspection unit 230 is moved up such that load cell 240 contacts the lower end of suction tube 68 of suction nozzle 62. Here, when suction tube 68 of suction nozzle 62 retreats inside body pipe 64, the retreat force of suction tube 68 is measured using load cell 240. However, as described above, among suction nozzles 62 there are suction nozzles with an internal spring (hereinafter also referred to as "nozzle with an internal spring") and there are suction nozzles without an internal spring (hereinafter also referred to as "nozzle without a spring"), and there is a different method for measuring the retreat force for nozzles with an internal spring and nozzles without a spring.

Figure 23:
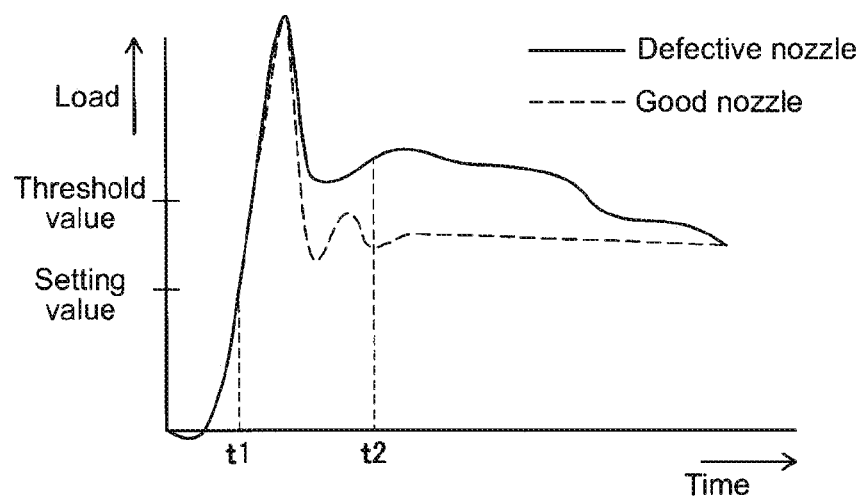
FIG. 23 shows the change over time of the load when the suction tube of a nozzle with an internal spring retreats inside the body pipe of the nozzle.

Specifically, for example, FIG. 23 shows the measurement values of load cell 240, that is, the change in the load, when suction tube 68 retreats inside body pipe 64 by the first set amount by moving inspection unit 230 up and contacting load cell 240 on the lower end of suction tube 68 of a nozzle with an internal spring. The solid line shown in the graph shows the change over time of the measurement values of load cell 240 for a suction nozzle (hereinafter also referred to as a "defective nozzle") for which it is difficult for suction tube 68 to retreat inside body pipe 64 due to the presence of a foreign object, damage, or the like. In contrast, the dotted line shown in the graph shows the change over time of the measurement values of load cell 240 for a suction nozzle (hereinafter also referred to as a "good nozzle") for which suction tube 68 retreats inside body pipe 64 correctly.

As understood from the figure, when load cell 240 contacts the tip of suction tube 68 of the nozzle with an internal spring by inspection unit 230 being moved up, the measurement value of load cell 240 becomes large rapidly. After increasing by a large amount, the measurement value of load cell 240 decreases and then converges to a generally fixed value. This is due to the fact that, because elastic force is applied to suction tube 68 of the nozzle with the internal spring, a large load is applied to load cell 240 when it is contacted against suction tube 68. Because this kind of load at the moment of collision is much larger than the load that occurs when suction tube 68 actually retreats, it is not desirable to include this load in the measurement values used for determination. In consideration of this, when inspecting the retreat force of suction tube 68 for a nozzle with an internal spring, values are extracted from the measurement values of load cell 240 such that values from the moment when suction tube 68 collides with load cell 240 are excluded.

In detail, measurement values of load cell 240 are monitored for a time after a preset setting value has been exceeded. This setting value is set to be value smaller than the load required for suction tube 68 to retreat inside body pipe 64 for a good nozzle. Then, extraction of measurement values is performed from a time (t1) at which the measurement value of load cell 240 exceeds the setting value until a time (t2=t1+T) after when specified time T has elapsed. Specifically, measurement values are extracted continuously for a given period. Then, an average value is calculated after removing the maximum and minimum loads from the extracted loads. Note that, extraction of measurement values continuously over a given period is performed N times until suction tube 68 has retreated inside body pipe 64 by the first set amount. That is, N number of average values of extracted loads are calculated. Then, it is determined whether the maximum calculated value among the calculated N number of values exceeds a threshold value. If the maximum calculated value exceeds the threshold value, it is determined that the nozzle with an internal spring that is the inspection target is a defective nozzle; if the maximum calculated value is equal to or less than the threshold value, it is determined that the nozzle with an internal spring that is the inspection target is a good nozzle. In this manner, it is possible to appropriately inspect the retreat force of suction tube 68 of a nozzle with an internal spring by using measurement values of load cell 240 excluding measurement values from the moment that suction tube 68 collides with load cell 240.

Figure 24:
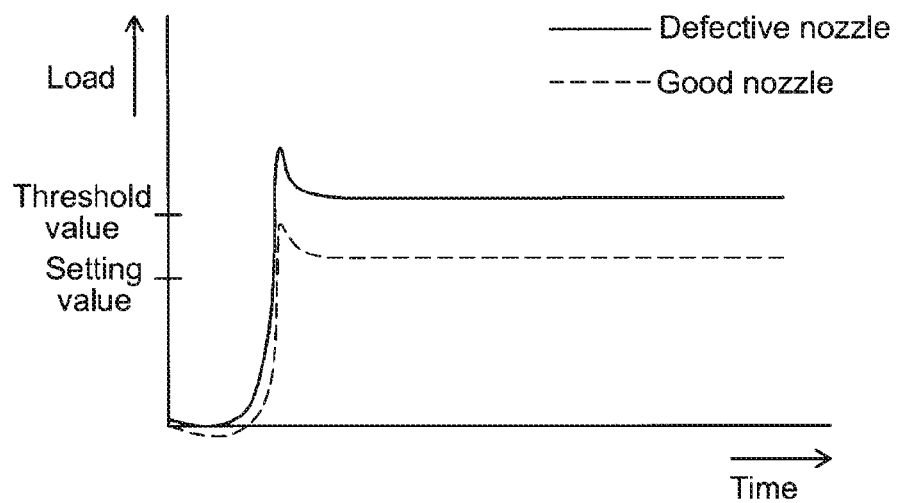
FIG. 24 shows the change over time of the load when the suction tube of a nozzle without a spring retreats inside the body pipe of the nozzle.

On the other hand, FIG. 24 shows the measurement values of load cell 240, that is, the change in the load, when suction tube 68 retreats inside body pipe 64 by the first set amount by moving inspection unit 230 up and contacting load cell 240 on the lower end of suction tube 68 of a nozzle without a spring. The solid line in the graph shows the change over time of the measurement values of load cell 240 for a defective nozzle and the dotted line in the graph shows the change over time of the measurement values of load cell 240 for a good nozzle.

As understood from the figure, when load cell 240 contacts the tip of suction tube 68 of the nozzle without a spring by inspection unit 230 being moved up, the measurement value of load cell 240 becomes large rapidly. However, because elastic force is not applied to suction nozzle 68 of the nozzle without a spring, the load when load cell 240 collides with suction tube 68 and the load when suction tube 68 retreats are substantially the same. Thus, when inspecting the retreat force of suction tube 68 of a nozzle without a spring, measurement values are extracted when the measurement value of load cell 240 exceeds a set value. Note that, the method of extracting measurement values for a nozzle without a spring is the same as the method of extracting measurement values for a nozzle with an internal spring. Then, based on the extracted measurement values, in a similar manner to that for nozzles with an internal spring, N number of average values of the load are calculated, and it is determined whether the maximum calculated value among the calculated N number of values exceeds a threshold value. By this, it is also possible to appropriately inspect the retreat force of suction tube 68 for nozzles without a spring.

When the above work of suction tube 68 tip section inspection and retreat force inspection is complete, nozzle pallet 152 is housed in pallet carrier 180 by operation of second pallet moving mechanism 266. Note that, inspection work results are linked with the ID number of suction nozzle 62 which is the target for inspection and stored.

(c) Work of Inspecting Suction Nozzles by the Second Nozzle Inspection Device

During inspection work of suction nozzles 62, when air flow amount inspection is performed by second nozzle inspection device 138, a pallet carrier 180 housing a prescribed nozzle pallet 152 is moved, as shown in FIG. 19, to a position corresponding to third pallet moving mechanism 296 by the operation of carrier circulating mechanism 182. Suction nozzles 62 which are targets for inspection are housed in the prescribed nozzle pallet 152.

Continuing, nozzle pallet 152 housed in the pallet carrier 180 is moved to the second inspection position by the operation of third pallet moving mechanism 296. Then, air supply device 276 of inspection head 270 is moved above suction nozzle 62 which is the target for inspection by head moving device 272. Air supply device 276 lowers air joint 278 by raising/lowering mechanism 282 and connects air joint 278 to body pipe 64 of suction nozzle 62 which is the target for inspection. When air joint 278 is connected to body pipe 64, air supply device 276 supplies air to the connected body pipe 64. Then, the air pressure while air is being supplied is measured by air pressure sensor 280 and it is determined whether the air pressure is larger than a first threshold pressure. When air is supplied to a normal condition suction nozzle 62, because air passes through suction nozzle 62, the air pressure measured by air pressure sensor 280 is relatively low. Conversely, when air is supplied to a suction nozzle 62 which is blocked or the like, air does not pass so easily through suction nozzle 62, thus the air pressure measured by air pressure sensor 280 is relatively high. Therefore, suction nozzles 62 for which the air pressure measured by air pressure sensor 280 is larger than a first threshold pressure are recognized as defective nozzles.

Note that, with air flow amount inspection, not only is recognition of defective nozzles performed, but recognition is performed of suction nozzles 62 which have a high probability of becoming defective nozzles, that is suction nozzles of which the condition has deteriorated (hereinafter sometimes referred to as "deteriorated nozzles"). In detail, a second threshold pressure which is lower than first threshold pressure is set. Then, it is determined whether the air pressure measured by air pressure sensor 280 is larger than a second threshold pressure, and suction nozzles 62 for which the air pressure is larger than the second threshold pressure are recognized as deteriorated nozzles. In other words, suction nozzles 62 for which, although not to the extent of a defective nozzle, air does not pass easily through the suction nozzle 62 to a certain extent are recognized as deteriorated nozzles.

Note that, during air flow amount inspection, air sent from a compressor (not shown) to air supply device 276 is supplied to suction nozzle 62, and the air pressure measured by air pressure sensor 280 changes depending on the operating conditions of the compressor. Therefore, before performing air flow amount inspection, air is supplied to reference pipe 174, and a first threshold pressure and a second threshold pressure are set based on the air pressure measured by air pressure sensor 280 as air is supplied to reference pipe 174.

Also, when performing code reading inspection, camera 274 of inspection head 270 is moved above suction nozzle 62 which is the target of inspection by head moving device 272, and 2D code 74 provided on flange 66 of suction nozzle 62 which is the target for inspection is imaged by camera 274. Thus, image data of 2D code 74 of suction nozzle 62 which is the target for inspection is obtained, and usually characteristic information of suction nozzle 62 such as an ID number is obtained based on the image data. However, if dirt and so on is on 2D code 74, there are cases in which characteristic information of suction nozzle 62 cannot be obtained based on the image data. Therefore, it is desirable to recognize suction nozzles 62 for which characteristic information of suction nozzle 62 cannot be obtained based on the image data as defective nozzles.

However, there is a worry that characteristic information of suction nozzle 62 cannot be obtained based on the image data even if there no dirt and so on 2D code 74, if there is a problem with camera 274 and so on. Thus, in cases in which characteristic information of suction nozzle 62 cannot be obtained based on image data, examination of camera 274 and so on is performed.

In detail, 2D code 74 provided on flange 66 of reference nozzle 172 is imaged by camera 274, and it is determined whether characteristic information of reference nozzle 172 is obtained based on the image data. So long as there is no dirt and so on on 2D code 74 of reference nozzle 172, and there are no problems which camera 274 and so on, characteristic information of reference nozzle 172 will be obtained based on the image data. Thus, if characteristic information cannot be obtained based on image data of 2D code 74 of suction nozzle 62 which is the target for inspection, and characteristic information is obtained based on image data of 2D code 74 of reference nozzle 172, suction nozzle 62 which is the target for inspection is recognized as a defective nozzle. Conversely, if characteristic information cannot be obtained based on image data of 2D code 74 of suction nozzle 62 which is the target for inspection, and characteristic information is not obtained based on image data of 2D code 74 of reference nozzle 172, it is taken that there is a problem with camera 274 and so on, and suction nozzle 62 which is the target for inspection is not recognized as a defective nozzle.

(d) Suction Nozzle Cleaning and Drying Work

When cleaning/drying work of suction nozzles 62 is performed, as shown in FIGS. 20 and 21, a pallet carrier 180 housing a prescribed nozzle pallet 152 is moved to a position corresponding to fourth pallet moving mechanism 330 by the operation of carrier circulating mechanism 182. Suction nozzles 62 which are targets for cleaning are housed in the prescribed nozzle pallet 152.

Continuing, nozzle pallet 152 housed in the pallet carrier 180 is moved to the nozzle cleaning position by the operation of fourth pallet moving mechanism 330. Then, high pressure water is supplied to each spray nozzle 312 of upper cleaning unit 306 and lower cleaning unit 308, and the high pressure water is sprayed from spray holes 316 of spray nozzles 312 towards nozzle pallet 152. Here, spray nozzles 312 are moved forwards/backwards by spray nozzle moving mechanism 314, that is, are moved in a direction intersecting the axis line of suction nozzles housed in nozzle pallet 152. Thus, high pressure water is sprayed on all suction nozzles 62 housed in nozzle pallet 152 such that cleaning of suction nozzles 62 is performed.

Figure 25:
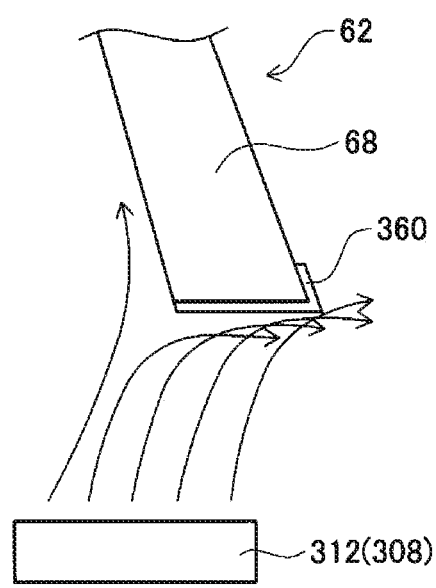
FIG. 25 is an enlarged view of the tip of the suction tube of the suction nozzle when the suction nozzle is being cleaned by a conventional nozzle cleaning device.

However, in cases in which a viscous fluid such as solder is adhered to the tip section of suction tube 68 of suction nozzle 62, it is difficult to remove the adhered matter by simply spraying high pressure water towards suction tube 68. It is especially difficult to remove adhered matter such as viscous fluid for a suction nozzle 62 for which the diameter of suction tube 68 gets larger as you move towards the tip section. In detail, for a suction nozzle 62 for which the diameter of suction tube 68 gets larger as you move towards the tip section, as shown in FIG. 25, when high pressure water is sprayed from spray nozzle 312 of lower cleaning unit 308 towards suction tube 68 of suction nozzle 62 housed in nozzle pallet 152, the high pressure water directly contacts the bottom surface of suction tube 68. Thus, matter adhered to the bottom surface of suction tube 68 is easily removed by high pressure water. However, adhered matter 360 on the outer side surface of the tip section of suction tube 68 is not directly contacted by the high pressure water. This is because a sharp angle is created between the bottom surface and the outer side surface of suction tube 68 due to the diameter of the tip section of suction tube 68 getting larger as you move towards the tip section, which means that the high pressure water sprayed from below does not reach the outer side surface of the tip section of suction tube 68. Therefore, adhered matter 360 adhered to the outer side surface of suction tube 68 cannot be removed appropriately simply by spraying high pressure water towards suction tube 68.

Figure 26:
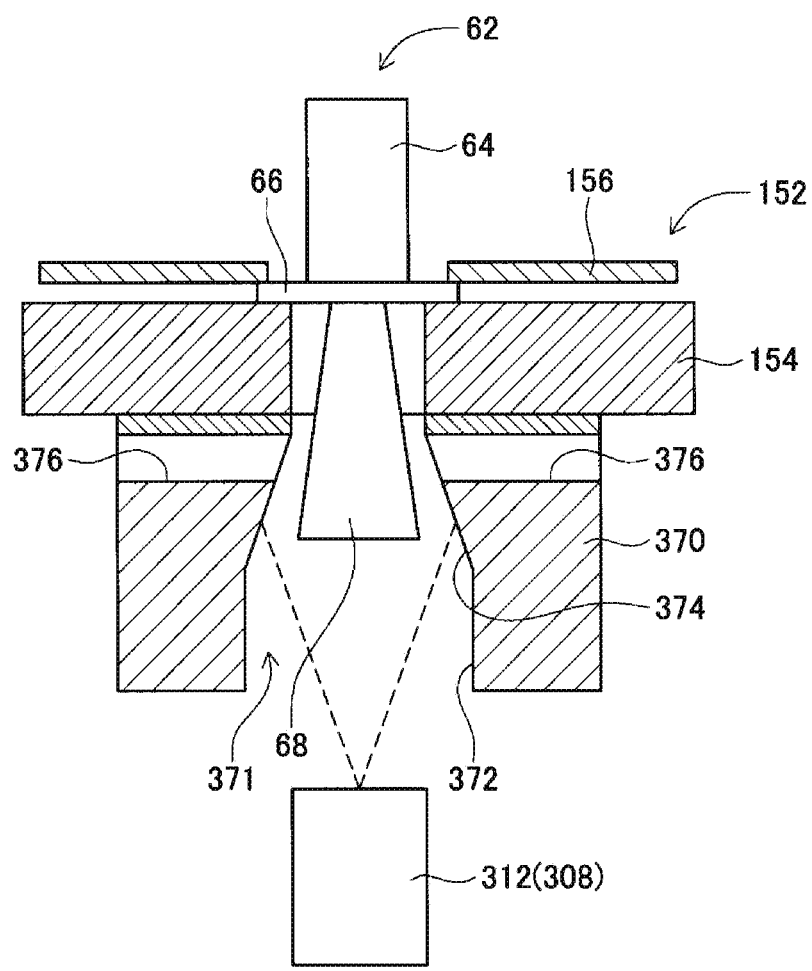
FIG. 26 is a cross section showing a nozzle pallet with a socket attached.

Considering this issue, as shown in FIG. 26, socket 370 for cleaning the suction tube of suction nozzle 62 is fixed to the lower surface of nozzle pallet 152. In detail, socket 370 has a largely cuboid shape and through-hole 371 is formed in socket 370 in a vertical direction. The inner diameter of through-hole 371 is larger than the outer diameter of suction tube 68 of suction nozzle 62 and socket 370 is fixed to the lower surface of nozzle pallet 152 such that the tip section of suction tube 68 is inserted inside through-hole 371. The internal surface of through-hole 371 is configured from first internal surface 372 and second internal surface 374. First internal surface 372 has an internal diameter that does not change in the vertical direction, and is positioned at the lower side of the internal surface of through-hole 371. On the other hand, second internal surface 374 is tapered so as the internal diameter becomes smaller towards the top, and is connected to the upper end of first internal surface 372. Note that, second internal surface 374 is positioned around the tip of suction tube 68 inserted into through-hole 371. Also, drainage path 376 that extends to the outer wall surface of socket 370 is formed in an upper section of second internal surface 374.

Figure 27:
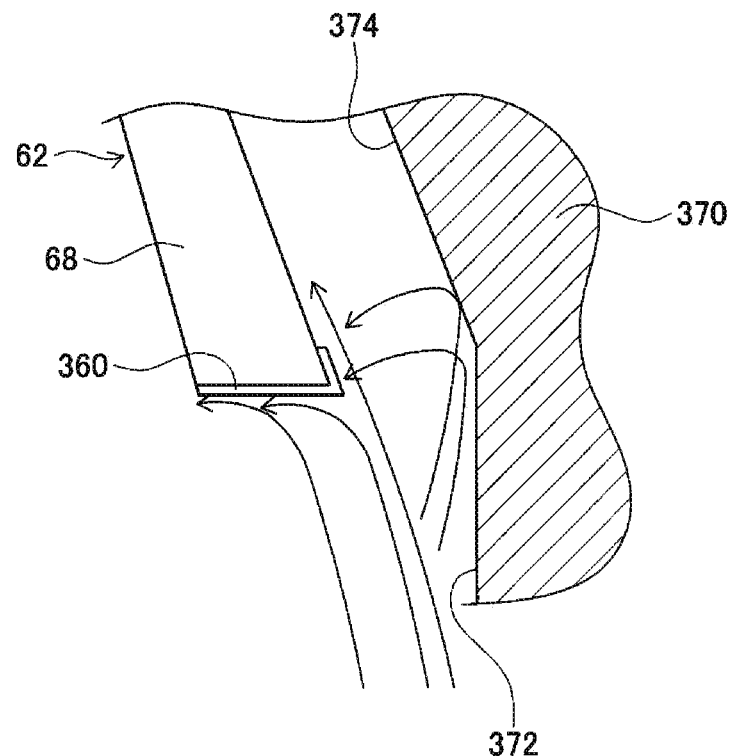
FIG. 27 is an enlarged view of the tip of the suction tube of the suction nozzle when the suction nozzle is being cleaned by the nozzle cleaning device of the present invention.

As shown in FIG. 27, when high pressure water is jetted from spray nozzle 312 of lower cleaning unit 308 towards suction tube 68 inserted into through-hole 371 of socket 370 with the above configuration, high pressure water sprayed from spray nozzle 312, of course, directly contacts the bottom surface of suction tube 68. Also, high pressure water jetted from spray nozzle 312 collides with second internal surface 374 and contacts the outer side surface of suction nozzle 62. That is, the jetting direction of high pressure water jetted from spray nozzle 312 is changed by second internal surface 374 such that high pressure water contacts the outer side surface of suction nozzle 62. Thus, it is possible to appropriately remove adhered matter not only from the bottom surface of suction tube 68, but also from the outer side surface of suction tube 68. The high pressure water sprayed inside through-hole 371 of socket 370, after cleaning suction tube 68, drains out of the outer wall of socket 370 via drainage path 376.

When cleaning suction nozzle 62, as described above, spray nozzle 312 is moved in a forwards/backwards direction by spray nozzle moving mechanism 314. Accordingly, high pressure water contacts the entire tip section of suction tube 68, and adhered matter 360 is reliably removed from the tip section of suction tube 68. In detail, multiple spray holes 316 of spray nozzle 312 are arranged in a straight line, and high pressure water is sprayed as a curtain from those multiple spray holes 316. Also, spray nozzle 312 is moved by spray nozzle moving mechanism 314 such that the high pressure water sprayed as a curtain cuts across the diameter direction of through-hole 371 of socket 370. When high pressure water sprayed as a curtain cuts across the diameter direction of through-hole 371 of socket 370, the locations at which high pressure water contacts socket 370 and suction tube 68 of suction nozzle 62 change as shown in FIGS. 28 to 31. FIGS. 28 to 31 show socket 370 from below with suction tube 68 inserted into through-hole 371. Also, marks 377 shown by solid lines in the figures show locations at which high pressure water sprayed from spray nozzle 312 directly contacts socket 370 or suction tube 68; marks 378 shown by dotted lines in the figures show locations at which the jetting direction of the high pressure water is changed by second internal surface 374, that is, locations at which high pressure water contacts suction tube 68 having been reflected off second internal surface 374.

Figure 28:
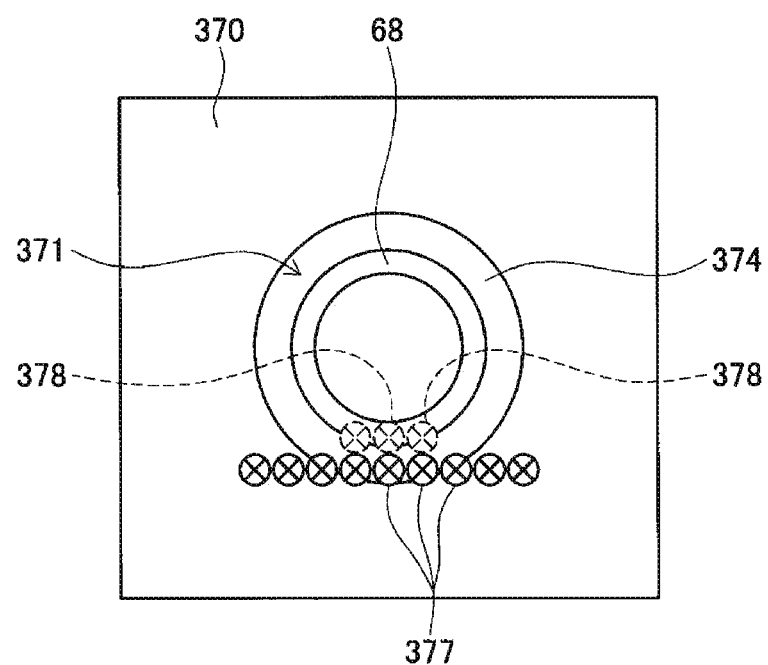
FIG. 28 is a view from below the socket of the location at which high pressure water is applied when the suction nozzle is cleaned using the socket.
Figure 29:
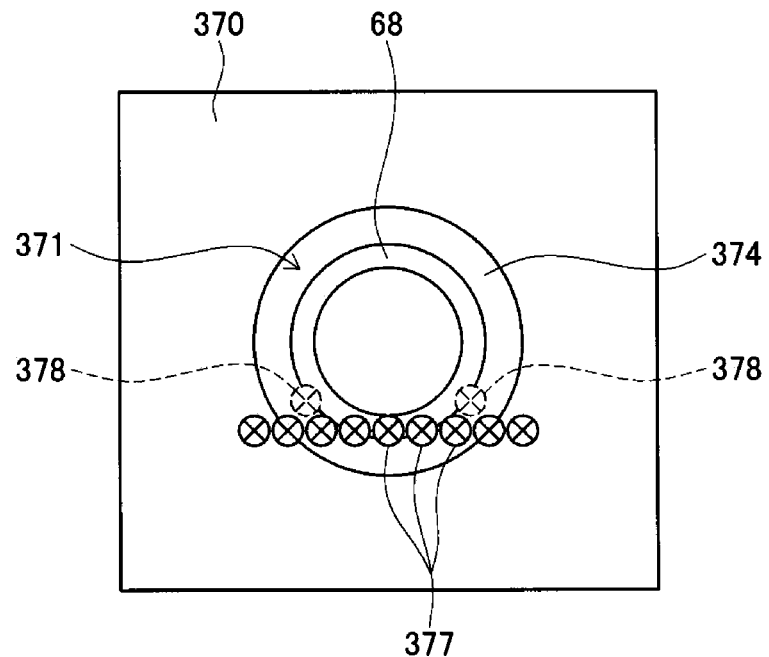
FIG. 29 is a view from below the socket of the location at which high pressure water is applied when the suction nozzle is cleaned using the socket.
Figure 30:
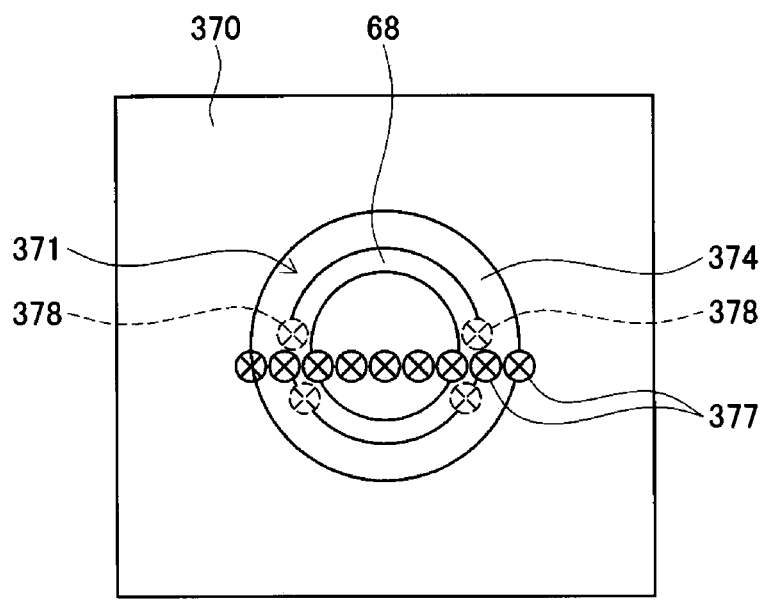
FIG. 30 is a view from below the socket of the location at which high pressure water is applied when the suction nozzle is cleaned using the socket.
Figure 31:
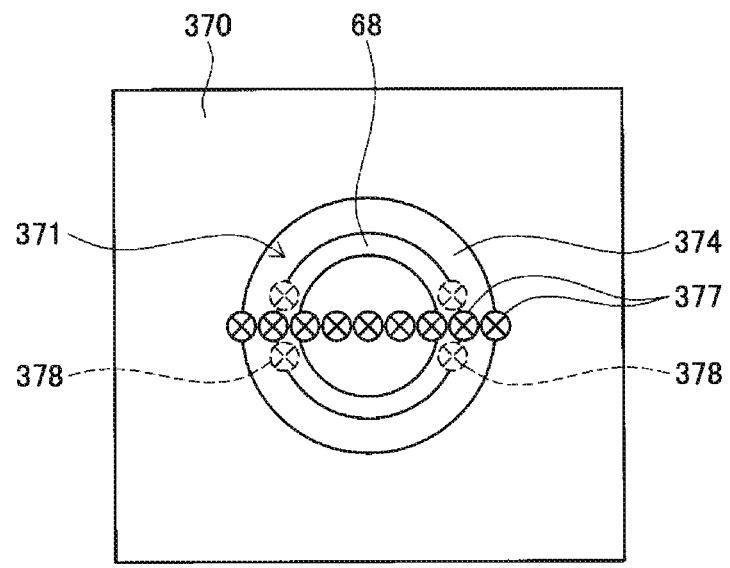
FIG. 31 is a view from below the socket of the location at which high pressure water is applied when the suction nozzle is cleaned using the socket.

First, when high pressure water is sprayed towards one end of through-hole 371 in the diameter direction, as shown in FIG. 28, high pressure water reflected by second internal surface 374 contacts the outer side surface of suction tube 68 at one end in the diameter direction. Then, when spray nozzle 312 is moved towards the other end of through-hole 371 in the diameter direction, as shown in FIG. 29, high pressure water reflected by second internal surface 374 contacts the outer side of suction tube 68 at different locations to those shown in FIG. 28. Then, when spray nozzle 312 is moved further towards the other end of through-hole 371 in the diameter direction, as shown in FIG. 30, high pressure water reflected by second internal surface 374 contacts the outer side of suction tube 68 at different locations to those shown in FIG. 29. Also, high pressure water sprayed from spray nozzles 312 contacts the bottom surface of suction tube 68. Then, when spray nozzle 312 is moved further towards the other end of through-hole 371 in the diameter direction, as shown in FIG. 31, high pressure water reflected by second internal surface 374 contacts the outer side of suction tube 68 at different locations to those shown in FIG. 30. Also, high pressure water sprayed from spray nozzles 312 contacts the bottom surface of suction tube 68 at different locations to those in FIG. 30. Accordingly, by moving spray nozzles 312 such that high pressure water sprayed in a curtain cuts across through-hole 371 of socket 370 in the diameter direction, high pressure water contacts the entire bottom surface of suction tube 68, and the entire outer side surface of suction tube 68, such that adhered matter 360 is reliably removed from the tip section of suction tube 68.

When cleaning of suction nozzles 62 is complete, nozzle pallet 152 is moved to the position at which nozzle drying mechanism 304 is arranged (hereinafter sometimes referred to as "drying position") by fourth pallet moving mechanism 330. Then, warm air is supplied to ventilation pipes 320 such that warm air is blown onto suction nozzles 62 housed in nozzle pallet 152. Thus, drying is performed of suction nozzles 62 cleaned by high pressure water. Note that, drying of suction nozzle 62 by blowing warm air is performed inside housing 300, and the bottom surface of housing 300, as described above, functions as a storage tank, with cleaning water used in nozzle cleaning mechanism 302 collecting there. Thus, there is a problem in that cleaning water collected on the bottom surface of housing 300 may be blown up by the warm air that is blown such that the cleaning water adheres to suction nozzle 62 again. However, as described above, separating plate 348 is provided between nozzle pallet 152 positioned at the drying position and the cleaning water collected on the bottom surface of housing 300, so as to prevent cleaning water from being blown up. By this, it is possible to prevent cleaning water from adhering again to suction nozzle 62 during drying of suction nozzle 62.

Further, when drying work of suction nozzles 62 is complete, nozzle pallet 152 is housed in pallet carrier 180 by the operation of fourth pallet moving mechanism 330. Note that, with regard to suction nozzles 62 for which cleaning/drying are complete, information indicating that cleaning/drying work are complete is linked to the ID number of the suction nozzle 62 and stored.

(e) Work of Loading to a Nozzle Tray by the Nozzle Management Device

When work is performed for loading suction nozzles 62 housed in nozzle management device 110 onto a nozzle tray 88, as shown in FIG. 15, an operator sets a nozzle tray 88 onto which suction nozzles 62 can be loaded onto fixed stage 210 or movable stage 212. Alternatively, a nozzle tray 88 onto which suction nozzles 62 can be loaded is set on movable stage 212 by the operation of stage moving mechanism 214. Also, with nozzle management device 110, a pallet carrier 180 housing a prescribed nozzle pallet 152 is moved to a position corresponding to first pallet moving mechanism 218 by the operation of carrier circulating mechanism 182. Suction nozzles 62 which are planned to be loaded onto nozzle tray 88 are housed in the prescribed nozzle pallet 152.

Continuing, nozzle pallet 152 housed in the pallet carrier 180 is moved to the nozzle transfer position by the operation of first pallet moving mechanism 218. Then, suction nozzles 62 loaded on nozzle pallet 152 are transferred to the nozzle tray 88 by nozzle transfer device 134. Note that, work of loading suction nozzles 62 loaded on nozzle pallet 152 to nozzle tray 88 is the same as work of loading suction nozzles 62 loaded on nozzle tray 88 to nozzle pallet 152. However, before being loaded on nozzle tray 88, suction nozzles 62 loaded on nozzle pallet 152 are dried by blow device 227.

In detail, as described above, suction nozzles 62 are cleaned by nozzle cleaning device 140 while loaded in nozzle pallet 152, and then dried after cleaning; however, due to the construction of nozzle pallet 152, it is difficult to reliably dry suction nozzles 62 using nozzle cleaning device 140. Specifically, as shown in FIGS. 13 and 14, for suction nozzles 62 housed in nozzle pallet 152, flange 66 is sandwiched by base plate 154 and cover plate 156. However, body pipe 64 and suction tube 68 protrude from nozzle pallet 152. Thus, when suction nozzle 62 is cleaned while housed in nozzle pallet 152, water gets between base plate 154 and cover plate 156 such that cleaning water adheres to flange 66. Further, with nozzle cleaning device 140, after suction nozzles 62 are cleaned, suction nozzles 62 are dried by warm air being blown while suction nozzles 62 are housed in nozzle pallet 152, but water that has gotten between base plate 154 and cover plate 156 is not blown off. Thus, there is a tendency for cleaning water to adhere to flange 66 of suction nozzle 62. However, cleaning water adhered to body pipe 64 and suction tube 68 is blown off by warm air being blown, such that body pipe 64 and suction tube 68 are dried.

Considering this problem, in a case when suction nozzles 62 are transferred from nozzle pallet 152 to nozzle tray 88, when suction nozzle 62 that is the transfer object is held by holding chuck 209, transfer head 206 moves above blow device 227 by operation of head moving device 207. Note that, holding chuck 209 holds an upper section of body pipe 64 of suction nozzle 62, and because the upper section of body pipe 64 is dry as described above, it is possible for holding chuck 209 to hold a dry location of suction nozzle 62, such that suction nozzle 62 can be appropriately held.

When moving head 206 moves above blow device 227, head moving device 207 lowers transfer head 206, and as shown in FIG. 17, inserts suction nozzle 62 held by holding chuck 209 inside main body section 228 of blow device 227. Here, transfer head 206 is lowered such that air ejection hole 229 is positioned to the side of flange 66 of suction nozzle 62. Then, blow device 227 blows air from air ejection hole 229 by operation of the air ejection device. When air is blown from air ejection hole 229, holding chuck 209 is rotated by operation of a rotating mechanism with suction nozzle 62 being held, such that air is blown on the entire surface of flange 66 of suction nozzle 62. By this, cleaning water adhered to flange 66 is blown off, and flange 66 is appropriately dried. Also, when drying of flange 66 is complete, transfer head 206 is moved above nozzle tray 88 by operation of head moving device 207, and held suction nozzle 62 is housed in loading hole 96 of nozzle tray 88. In this manner, with nozzle management device 110, suction nozzles 62 that have been reliably dried are housed in nozzle tray 88. Note that, nozzle pallet 152 for which transfer of suction nozzles 62 to nozzle tray 88 is complete is housed in pallet carrier 180 by the operation of first pallet moving mechanism 218.

(f) Work of Discarding Defective Nozzles

As shown in FIG. 15, during work of discarding a defective nozzle, a pallet carrier 180 housing a prescribed nozzle pallet 152 is moved to a position corresponding to first pallet moving mechanism 218 by the operation of carrier circulating mechanism 182. Defective nozzles are housed in that prescribed nozzle pallet 152. Next, nozzle pallet 152 housed in the pallet carrier 180 is moved to the nozzle transfer position by the operation of first pallet moving mechanism 218. Then, defective nozzles loaded on nozzle pallet 152 are put into discard box 222 by nozzle transfer device 134. Note that, work of discarding defective nozzles loaded on nozzle pallet 152 to discard box 222 is similar to work of loading suction nozzles 62 loaded on nozzle tray 88 to nozzle pallet 152. Defective nozzles are put into discard box 222 such that damage is avoided as far as possible.

In detail, within the defective nozzles, there are nozzles which can be restored by repair work or the like. Thus, if defective nozzles are put into discard box 222 in a disorderly fashion, nozzles may collide with each other, or suffer impact when being put into discard box 222, thus causing the defective nozzles to become unable to be restored. Considering this problem, when putting defective nozzles into discard box 222, the defective nozzle gripped by holding chuck 209 is released when above first inclined section 224 of discard box 222.

Specifically, when a defective nozzle that is to be discarded is held by holding chuck 209, transfer head 206, as shown in FIG. 16, is moved above first inclined section of discard box 222 by operation of head moving device 207. Then, at that position, the grip of holding chuck 209 on the defective nozzle is released. That is, the defective nozzle is released above first inclined section 224. By this, the defective nozzles falls on first inclined section 224. As described above, because first inclination section 224 is an inclined surface, defective nozzles that land on first inclination section 224, fall down onto flat section 225. Then, defective nozzles stop on flat section 225. Also, even if a defective nozzle rolls hard down first inclination section 224 and crosses flat surface 225, the defective nozzle rolls to second inclination section 226, and is returned to flat section 225. In this manner, defective nozzles put into discard box 222 stop on flat surface 225.

Thus, even in a case in which defective nozzles are put into discard box 222 consecutively, because the defective nozzles are released above first inclined section 224, fallen defective nozzles are prevented from strongly colliding with defective nozzles inside discard box 222. By this, it is possible to suitably prevent damage to nozzles caused by nozzles colliding with each other. Also, because first inclination section 224, flat section 225, and second inclination section 226 are formed from a cushion material, the impact when a defective nozzle falls, rolls down from first inclination section 224, and so on, is relatively small, and it is possible to suitably prevent damage to suction nozzles.

Note that, in the above embodiment, suction nozzle 62 is an example of a suction nozzle. Body pipe 64 is an example of a pipe. Suction tube 68 is an example of a suction tube. Head moving device 207 is an example of a moving device. Holding chuck 209 is an example of a holding tool. Disposal box 222 is an example of a collection box. First inclined section 224 is an example of an inclined surface. Flat section 225 is an example of a flat surface. Load cell 240 is an example of a load sensor. Metal contact tool 242 is an example of a rigid body.

Further, the present invention is not limited to the above example embodiments, and various changed or improved methods of embodiment are possible based on the knowledge of someone skilled in the art. Specifically, for example, in the above embodiment, when the retreat force of suction tube 68 is measured, load cell 240 is moved above inspection unit 230 on which metal contact tool 242 or the like is loaded, and body pipe 64 and suction tube 68 of suction nozzle 62 are moved relatively; however, suction nozzle 62 may be moved down such that suction tube 68 of suction nozzle 62 are moved relatively.

Figure 32:
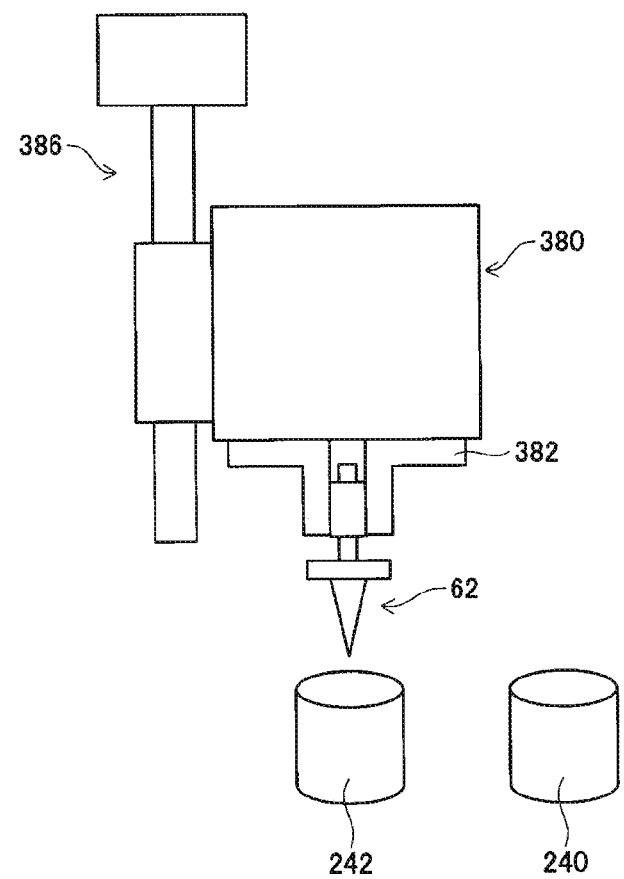
FIG. 32 shows an alternative embodiment inspection head for performing retreat force inspection of a suction tube.

Specifically, as shown in FIG. 32, suction nozzle 62 is gripped by holding chuck 382 of inspection head 380. Inspection head 380 is able to be moved to any position in the XYZ directions by operation of moving device 386, and inspection head 380 holding the suction nozzle 62 is lowered after being moved over metal contact tool 242, thus allowing inspection of the relative movement state between body pipe 64 and suction tube 68. Also, suction nozzle 62 for which body pipe 64 and suction tube 68 have moved relatively by a first set amount is held by inspection head 380, and then by inspection head 380 being lowered after being moved above load cell 240, the retreat force of suction tube 68 is measured. Thus, measurement of the retreat force of suction tube 68 is allowed by moving the suction nozzle down.

Also, with suction nozzle 62 of the above embodiment, suction tube 68 is arranged inside body pipe 64. That is, body pipe 64 functions as an outer pipe of suction tube 68; however, body pipe 64 may be arranged inside suction tube 68, and body pipe 64 may function as an internal pipe of suction tube 68.

Also, in the above embodiment, when performing retreat force inspection of suction tube 68, a measurement value of load cell 240, that is, the timing of when the load exceeds a set value, is monitored; however, the timing of when an index value representing the measurement value of load cell 240 such as current, voltage, or the like exceeds a set value may be monitored.

Various embodiments of the present invention are described below.

(0) A load measurement method for measuring a load that arises when a suction tube, which is for picking up and holding a component via the suction of air, and a pipe, which holds the suction tube internally so as to be relatively movable with a tip section of the suction tube protruding from the pipe, move relative to each other by a specified amount.

The embodiment of this clause provides the basic configuration of the present invention.

(1) The load measurement method according to (0), including: a moving step of moving the suction nozzle and a rigid body in a direction to approach each other using a predetermined set load, the tip section of the suction nozzle being in contact with the suction tube; and a load measuring step for using a load sensor to measure a load that arises when the suction tube and the pipe move relative to each other while the tip section of the suction tube and the load sensor are in contact in a case in which the suction nozzle and the load sensor are moved in a direction to approach each other, with the tip section of the suction tube and the load sensor facing each other, and on condition that the suction tube and the pipe have moved relative to each other by the specified amount in the moving step.

According to this aspect, it is possible to measure nozzle load using a load sensor for a suction nozzle for which the suction tube and the tube are able to move relatively by a set amount, and it is possible to prevent a large load being applied to the load sensor.

(2) The load measurement method according to (1), wherein the set load is smaller than a load at which the suction nozzle is damaged when the suction nozzle and the rigid body are moved in a direction approaching each other in a state with the tip section of the suction tube in contact with the rigid body.

According to this aspect, using a rigid body it is possible to prevent damage to a suction nozzle when inspecting the relative movement amount during relative movement between the suction tube and the pipe.

(3) The load measurement method according to (1) or (2), wherein in the load measuring step, measurement is performed by the load sensor of the load that arises when the suction tube and the pipe move relative to each other while the tip section of the suction tube and the load sensor are in contact with each other in a case in which the suction nozzle is moved in a direction approaching the load sensor with the load sensor and the tip section of the suction tube facing each other.

According to this aspect, it is possible to appropriately measure the load arising during relative movement between the suction tube and the pipe even when the holding head that holds that suction nozzle is very heavy.

(4) The load measurement method according to any one of (0) to (3), further comprising: a first load extracting step for extracting a load measured by the load sensor after a predetermined set time has elapsed after an index value representing the load measured in the load measurement step exceeds a threshold value in a case in which the suction nozzle is provided with an elastic body that exerts an elastic force against the relative movement of the suction tube and the pipe; and a second load extracting step for extracting a load measured by the load sensor after an index value representing the load measured in the load measurement step exceeds a threshold value in a case in which the suction nozzle is not provided with the elastic body.

According to this aspect, considering that a large load is exerted when the suction tube of a nozzle with an internal spring contacts the load sensor, a load measured by the load sensor is extracted after a predetermined set time has elapsed after an index value representing the measured load exceeds a threshold value when measuring the load of a nozzle with an internal spring. Conversely, considering that the load that arises when the suction tube of a nozzle without a spring contacts the load sensor is almost the same of the load arising during relative movement of the suction tube and the pipe, a load measured by the load sensor is extracted after an index value representing the measured load exceeds a threshold value when measuring the load of a nozzle with an internal spring. Thus, it is possible to appropriately measure the load arising during relative movement of the suction tube and the pipe for both a nozzle with an internal spring and a nozzle without a spring.

(5) A collection method for collecting the suction nozzle judged not to be normal based on the load extracted in the first load extracting step or the second load extracting step, the collection method comprising: a holding step of holding, via a holding tool, the suction nozzle for which the load extracted in the first load extracting step or the second load extracting step exceeds a predetermined tolerance load; a moving step of moving, via a moving device, the holding tool that held the suction nozzle in the holding step above an inclined surface of a collection box with a bottom surface configured from the inclined surface and an uninclined flat surface connected to a lower edge of the inclined surface; and a releasing step of releasing the suction nozzle from the holding tool after the holding tool has been moved above the inclined surface in the moving step.

According to this aspect, the bottom surface of the collection box for collecting suction nozzles is configured from an inclined surface and an uninclined flat surface connected to a lower edge of the inclined surface. When a suction nozzle determined to be abnormal is put into the collection box, the holding tool releases the suction nozzle above the inclined surface. The suction nozzle falls onto the inclined surface, and rolls down onto the flat surface, where it then remains. Accordingly, even when suction nozzles are put into the collection box consecutively, because the suction nozzles are released above the inclined surface, falling suction nozzles do not collide strongly with suction nozzles already inside the collection box. By this, it is possible to suitably prevent damage to nozzles caused by nozzles colliding with each other.

(6) The collection method according to (5), wherein the top surface of the inclined surface is formed from a buffering material.

According to this aspect, it is possible to reduce the impact when a suction nozzle falls, thus preventing damage to the suction nozzle.

(7) The collection method according to (5) or (6), wherein the top surface of the flat surface is formed from a buffering material.

According to this aspect, it is possible to reduce the impact when a suction nozzle rolls and falls onto the flat surface, thus preventing damage to the suction nozzle.

(8) The collection box for collecting suction nozzles has a bottom surface configured from an inclined surface and an uninclined flat surface connected to a lower edge of the inclined surface.

According to this aspect, it is possible to realize the same effects as aspect (5).

(9) The collection box according to (8), wherein the top surface of the inclined surface is formed from a buffering material.

According to this aspect, it is possible to realize the same effects as aspect (6).

(10) The collection method according to (8) or (9), wherein the top surface of the flat surface is formed from a buffering material.

According to this aspect, it is possible to realize the same effects as aspect (7).

REFERENCE SIGNS LIST

62: suction nozzle; 88: nozzle tray (loading stage); 140: nozzle cleaning device; 152: nozzle pallet (nozzle support tool); 154: base plate (support plate); 156: cover plate; 207:

head moving device (moving device); 209: holding chuck (holding tool); 227: blow device (nozzle drying device); 228: main body section; 229: air ejection hole; 300: housing (cleaning box); 312: spray nozzle (water jetting apparatus); 314: spray nozzle moving device (water jetting apparatus moving device); 320: ventilation pipe (air jetting apparatus); 340: drainage path; 342: filter (filter device); 344: booster pump (pump); 348: separating plate; 370: socket (jetting direction changing mechanism) (protruding section); 374: second internal surface (tapered surface); 376: drainage path

The invention claimed is:

1. A nozzle management device comprising:
   a plurality of pallets, each of the pallets configured to house a plurality of nozzles;
   a pallet housing configured to store the pallets;
   a pallet moving mechanism configured to move the pallets;
   a stage configured to accept a first pallet; and
   a nozzle transfer device configured transfer a nozzle from the first pallet to a second pallet, wherein
   the pallet moving mechanism is configured to move the second pallet to a processing position.

2. The nozzle management device according to claim 1, wherein the pallet moving mechanism is configured to move the pallets at least in a direction normal to a top surface of the pallets.

3. The nozzle management device according to claim 2, wherein
   the pallet moving mechanism includes a first pallet moving mechanism and a second pallet moving mechanism,
   the first pallet moving mechanism is configured to move the pallets in a first direction that is the direction normal to the top surface of the pallets, and
   the second pallet moving mechanism is configured to move the pallets in a second direction that is perpendicular to the first direction.

4. The nozzle management device according to claim 3, wherein the second pallet moving mechanism is configured to move the second pallet to and from a storage position in the second direction.

5. The nozzle management device according to claim 4, wherein the second pallet moving mechanism is configured to move the second pallet to the storage position based upon an identification number.

6. The nozzle management device according to claim 2, wherein
   the pallet moving, mechanism includes a first pallet moving mechanism and a second pallet moving mechanism,
   the first pallet moving mechanism is configured to move the pallets in a first direction that is the direction normal to the top surface of the pallets, and
   the second pallet moving mechanism is configured to move the second pallet to and from the processing position in a second direction that is perpendicular to the first direction.

7. The nozzle management device according to claim 1, further comprising a nozzle inspection device configured to inspect the nozzle.

8. The nozzle management device according to claim 7, wherein the processing position is an inspection position.

9. The nozzle management device according to claim 8, wherein the nozzle inspection device is configured to inspect the nozzle when the second pallet is at the inspection position.

10. The nozzle management device according to claim 7, wherein the nozzle inspection device includes a camera.

11. The nozzle management device according to claim 1, further comprising a nozzle cleaning device configured to clean the nozzle.

12. The nozzle management device according to claim 11, wherein the processing position is a cleaning position.

13. The nozzle management device according to claim 12, wherein the nozzle cleaning device is configured to clean the nozzle when the second pallet is at the cleaning position.

14. The nozzle management device according to claim 11, wherein the nozzle cleaning device includes a spraying nozzle and a dryer.

15. The nozzle management device according to claim 1, wherein the pallet housing is configured to store the pallets such that multiple pallets overlap in a direction normal to a top surface of the pallets.

16. A nozzle management device comprising:
    a plurality of means for housing a plurality of nozzles;
    means for storing the plurality of means for housing a plurality of nozzles;
    means for moving the plurality of means for housing a plurality of nozzles;
    means for accepting a first means for housing a plurality of nozzles; and
    means for transferring a nozzle from the first means for housing a plurality of nozzles to a second means for housing a plurality of nozzles, wherein
    the means for moving the plurality for housing a plurality of nozzles moves the second means for housing a plurality of nozzles to a processing position.

17. The nozzle management device according to claim 16, wherein the means for moving the plurality of means for housing a plurality of nozzles moves the plurality of means for housing a plurality of nozzles at least in a direction normal to a top surface of the plurality of means for housing a plurality of nozzles.

18. The nozzle management device according to claim 17, wherein
    the means for moving the plurality of means for housing a plurality of nozzles includes a first means for moving the plurality of means for housing a plurality of nozzles and a second means for moving the plurality of means for housing a plurality of nozzles,
    the first means for moving the plurality of means for housing a plurality of nozzles moves the plurality of means for housing a plurality of nozzles in a first direction that is the direction normal to the top surface of the plurality of means for housing a plurality of nozzles, and
    the second means for moving the plurality of means for housing a plurality of nozzles moves the plurality of means for housing a plurality of nozzles in a second direction that is perpendicular to the first direction.

19. The nozzle management device according to claim 18, wherein the second means for moving the plurality of means for housing a plurality of nozzles moves the second means for housing a plurality of nozzles to and from a storage position in the second direction.

20. The nozzle management device according to claim 19, wherein the second means for moving the plurality of means for housing a plurality of nozzles moves the second means for housing a plurality of nozzles to the storage position based upon an identification number.

21. The nozzle management device according to claim 17, wherein
    the means for moving the plurality of means for housing a plurality of nozzles includes a first means for moving the plurality of means for housing a plurality of nozzles and a second means for moving the plurality of means for housing a plurality of nozzles, the first means for moving the plurality of means for housing a plurality of nozzles moves the plurality of means for housing a plurality of nozzles in a first direction that is the direction normal to the top surface of the plurality of means for housing a plurality of nozzles, and the means for moving the plurality of means for housing a plurality of nozzles moves the second means for housing a plurality of nozzles to and from the processing position in a second direction that is perpendicular to the first direction.

22. The nozzle management device according to claim 16, further comprising means for inspecting the nozzle.

23. The nozzle management device according to claim 22, wherein the processing position is an inspection position.

24. The nozzle management device according to claim 23, wherein the means for inspecting the nozzle inspects the nozzle when the second means for housing a plurality of nozzles is at the inspection position.

25. The nozzle management device according to claim 16, further comprising means for cleaning the nozzle.

26. The nozzle management device according to claim 25, wherein the processing position is a cleaning position.

27. The nozzle management device according to claim 26, wherein the means for cleaning the nozzle cleans the nozzle when the second means for housing a plurality of nozzles is at the cleaning position.

28. The nozzle management device according to claim 16, wherein the means for storing the plurality of means for housing a plurality of nozzles stores the plurality of means for housing a plurality of nozzles such that multiple means for housing a plurality of nozzles overlap in a direction normal to a top surface of the plurality of means for housing a plurality of nozzles.

\* \* \* \* \*